(12) United States Patent
Nakamura et al.

(10) Patent No.: US 11,949,360 B2
(45) Date of Patent: Apr. 2, 2024

(54) CONTROL DEVICE

(71) Applicant: DENSO CORPORATION, Kariya (JP)

(72) Inventors: Kouichi Nakamura, Kariya (JP); Nobuyori Nakazima, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/650,633

(22) Filed: Feb. 10, 2022

(65) Prior Publication Data
US 2022/0166365 A1 May 26, 2022

Related U.S. Application Data

(63) Continuation of application No. PCT/JP2020/030601, filed on Aug. 11, 2020.

(30) Foreign Application Priority Data

Aug. 15, 2019 (JP) ................. 2019-149071

(51) Int. Cl.
| G05B 5/00 | (2006.01) |
| G01R 31/34 | (2020.01) |
| H02H 7/08 | (2006.01) |
| H02P 1/00 | (2006.01) |
| H02P 3/00 | (2006.01) |
| H02P 29/024 | (2016.01) |
| B62D 5/04 | (2006.01) |

(52) U.S. Cl.
CPC .......... *H02P 29/024* (2013.01); *G01R 31/343* (2013.01); *B62D 5/0487* (2013.01)

(58) Field of Classification Search
CPC ........ H02P 29/024; H02P 6/08; H02P 29/028; G01R 31/343; B62D 5/0487; B62D 5/046; B62D 5/0493
See application file for complete search history.

(56) References Cited

U.S. PATENT DOCUMENTS

| 2008/0306650 A1* | 12/2008 | Nakagaki ............... G07C 5/085 701/33.4 |
| 2014/0253006 A1* | 9/2014 | Satou .................... H02P 29/032 318/442 |
| 2019/0144029 A1 | 5/2019 | Taki et al. |
| 2019/0260324 A1 | 8/2019 | Kuramitsu et al. |

(Continued)

FOREIGN PATENT DOCUMENTS

JP 2017-175792 A 9/2017

OTHER PUBLICATIONS

U.S. Appl. No. 17/650,627 and its entire file history filed Feb. 10, 2022, Kouichi Nakamura.

*Primary Examiner* — Erick D Glass
(74) *Attorney, Agent, or Firm* — MASCHOFF BRENNAN

(57) ABSTRACT

A control device is configured to control an operation of a control target. The control device is configured to monitor an abnormality. The control device is configured to store abnormality information according to an abnormality monitor result. When the abnormality of a monitor target is detected, an abnormality treatment confirmation determination related to a transition determination to an abnormality treatment due to an occurrence of the abnormality is different from an abnormality storage confirmation determination that causes the control device to store, as the abnormality information, the abnormality of the monitor target.

11 Claims, 17 Drawing Sheets

(56) References Cited

U.S. PATENT DOCUMENTS

| | | |
|---|---|---|
| 2020/0317258 A1 | 10/2020 | Nakamura et al. |
| 2021/0102561 A1* | 4/2021 | Aki ....................... F15B 15/204 |
| 2021/0135597 A1* | 5/2021 | Hario ...................... H02M 7/48 |
| 2022/0075702 A1* | 3/2022 | Matsuda ................. H04L 12/40 |
| 2023/0005305 A1* | 1/2023 | Sakurai ................... G06F 13/00 |

* cited by examiner

US 11,949,360 B2

CONTROL DEVICE

CROSS REFERENCE TO RELATED APPLICATIONS

The present application is a continuation application of International Patent Application No. PCT/JP2020/030601 filed on Aug. 11, 2020, which designated the U.S. and claims the benefit of priority from Japanese Patent Application No. 2019-149071 filed on Aug. 15, 2019. The entire disclosures of all of the above applications are incorporated herein by reference.

TECHNICAL FIELD

The present disclosure relates to a control device.

BACKGROUND

There is known a rotary electric machine control device that controls driving of a motor by a plurality of control units. For example, two control units are provided, and two systems are operated in cooperation by transmitting a command value calculated by a master control unit to a slave control unit. When an inter-microcomputer communication abnormality occurs, the process shifts to independent drive control.

SUMMARY

The present disclosure provides a control device. The control device is configured to control an operation of a control target. The control device is configured to monitor an abnormality. The control device is configured to store abnormality information according to an abnormality monitor result. When the abnormality of a monitor target is detected, an abnormality treatment confirmation determination related to a transition determination to an abnormality treatment due to an occurrence of the abnormality is different from an abnormality storage confirmation determination that causes the control device to store, as the abnormality information, the abnormality of the monitor target.

BRIEF DESCRIPTION OF DRAWINGS

The features and advantages of the present disclosure will become more apparent from the following detailed description made with reference to the accompanying drawings. In the drawings.

DETAILED DESCRIPTION

Figure 1:
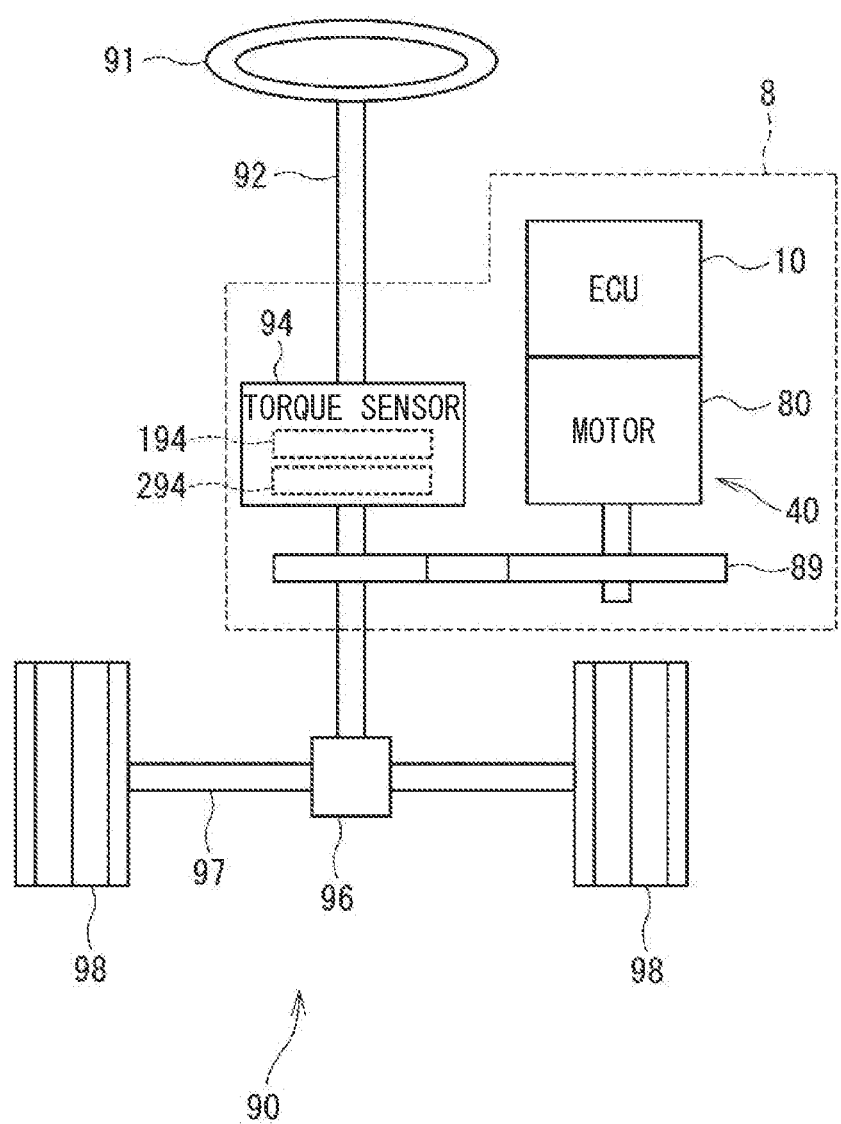
FIG. 1 is a schematic configuration diagram of a steering system according to a first embodiment.

For example, an abnormal operation of the device such as communication abnormality between microcomputers may be caused not only by an abnormality inside the device but also by an abnormality of power supply from a power source. Here, if an abnormality such as a momentary power interruption due to an external factor is stored as a history, an unnecessary repair or replacement may be performed.

The present disclosure provides a control device capable of appropriately storing an abnormal state.

An exemplary embodiment of the present disclosure provides a control device that includes an operation control unit, an abnormality monitor unit, and a storage unit. The operation control unit is configured to control an operation of a control target. The abnormality monitor unit is configured to monitor an abnormality. The storage unit is configured to store abnormality information according to an abnormality monitor result. When the abnormality of a monitor target is detected, an abnormality treatment confirmation determination related to a transition determination to an abnormality treatment due to an occurrence of the abnormality is different from an abnormality storage confirmation determination that causes the storage unit to store, as the abnormality information, the abnormality of the monitor target.

In the exemplary embodiment of the present disclosure, the monitored abnormality can be appropriately stored.

A control device according to the present disclosure will be described below with reference to the drawings. Hereinafter, in a plurality of embodiments, substantially the same components are denoted by the same reference numerals, and descriptions of the same components will be omitted.

First Embodiment

Figure 11:
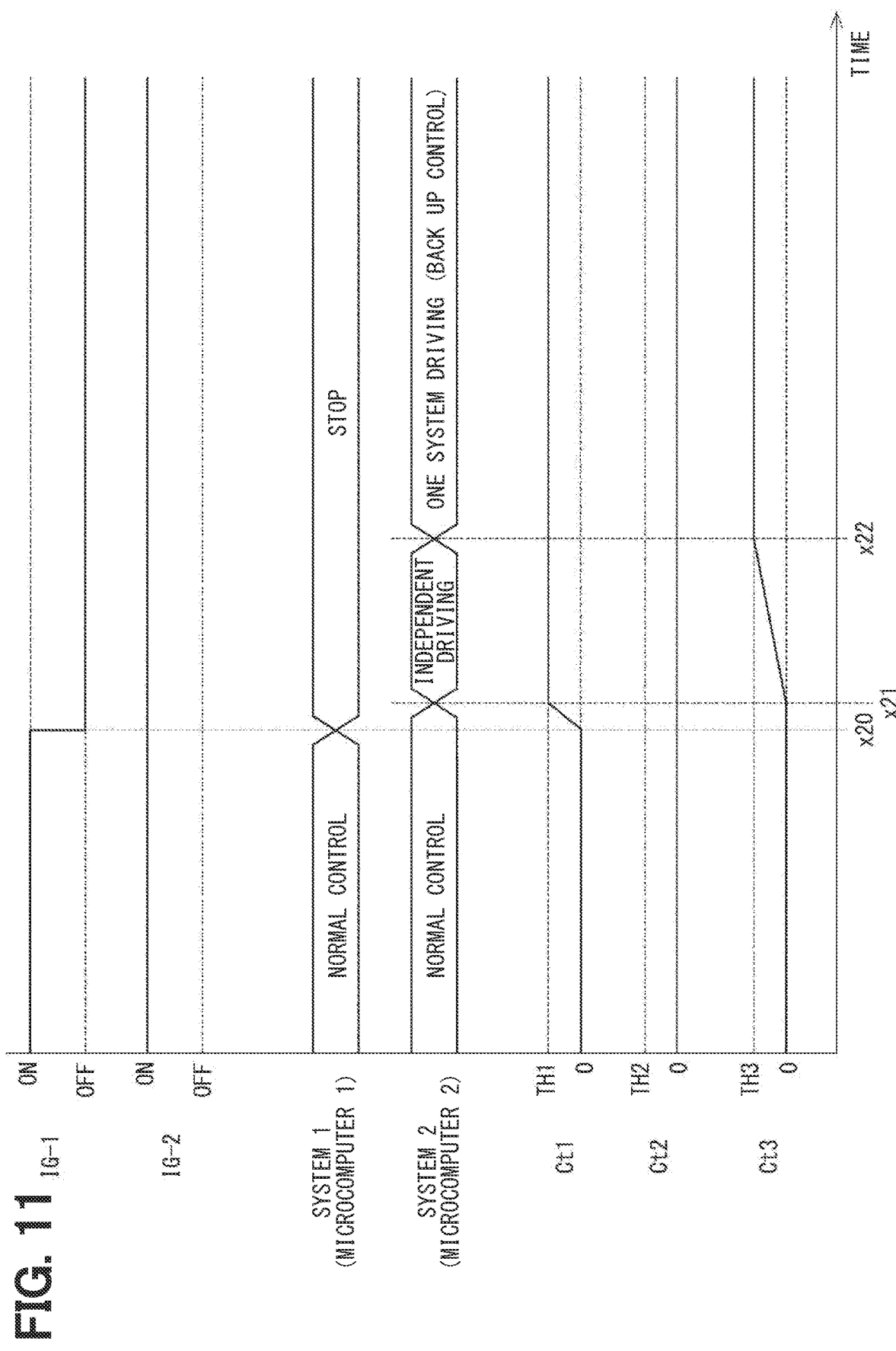
FIG. 11 is a time chart for explaining communication abnormality process according to the first embodiment.
Figure 12:
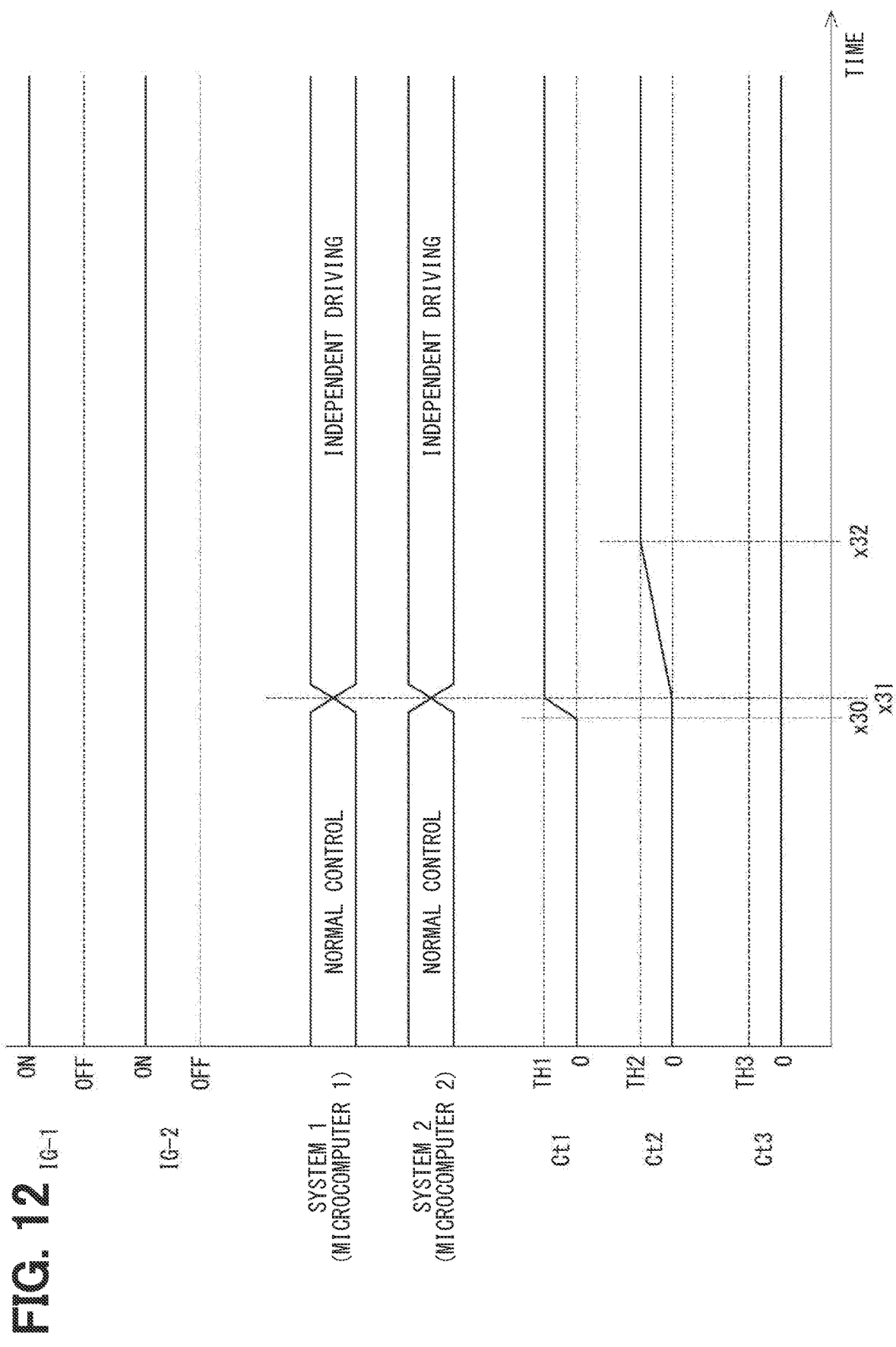
FIG. 12 is a time chart for explaining communication abnormality process according to the first embodiment.
Figure 13:
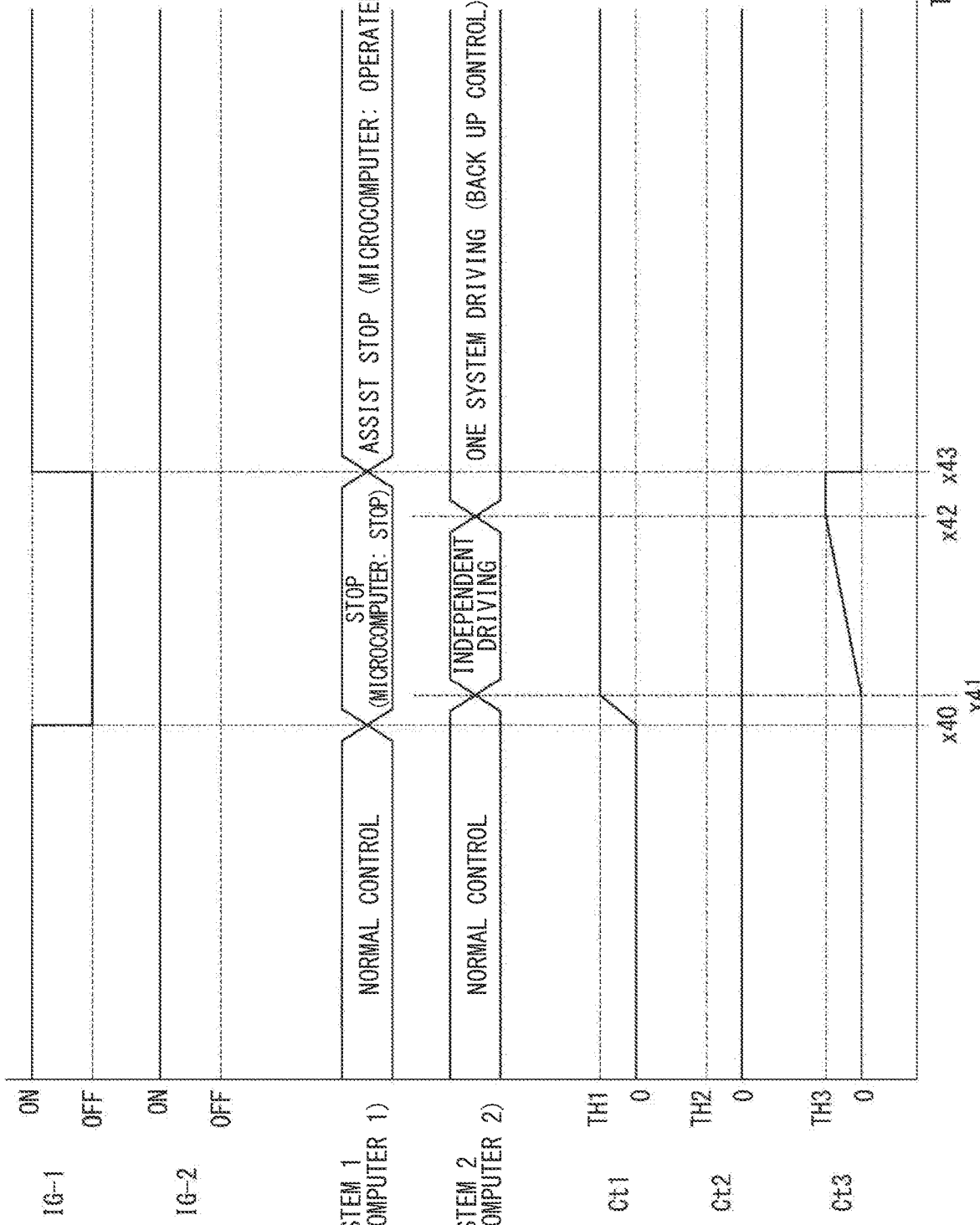
FIG. 13 is a time chart for explaining communication abnormality process according to the first embodiment.

A first embodiment is shown in FIG. 11 to FIG. 13. As shown in FIG. 1, an ECU 10 provided as a control device is a motor control device configured to control driving of a motor 80 that is a rotary electric machine. The ECU 10 is used together with the motor 80 as an electric power steering device 8 that assists a steering operation of a vehicle. FIG. 1 shows a configuration of a steering system 90 including the electric power steering device 8. The steering system 90 includes a steering wheel 91 as a steering member, a steering shaft 92, a pinion gear 96, a rack shaft 97, wheels 98, the electric power steering device 8, and the like.

The steering wheel 91 is connected to the steering shaft 92. A torque sensor 94 is provided on the steering shaft 92 to detect a steering torque. The torque sensor 94 has a first sensor unit 194 and a second sensor unit 294, each of which is capable of detecting its own failure. A pinion gear 96 is provided at an axial end of the steering shaft 92. The pinion gear 96 meshes with a rack shaft 97. A pair of road wheels 98 is coupled at both ends of the rack shaft 97 via, for example, tie rods.

When a driver of the vehicle rotates the steering wheel 91, the steering shaft 92 connected to the steering wheel 91 rotates. A rotational movement of the steering shaft 92 is converted into a linear movement of the rack shaft 97 by the pinion gear 96. The pair of road wheels 98 is steered to an angle corresponding to a displacement amount of the rack shaft 97.

The electric power steering device 8 includes the motor 80, a reduction gear 89, the ECU 10 and the like. The reduction gear 89 is a power transmission mechanism that reduces the rotation of the motor 80 and transmits the reduced rotation to the steering shaft 92. That is, the electric power steering device 8 of the present embodiment is a column assist type, in which the steering shaft 92 is an object to be driven. The electric power steering device 8 may be a rack assist type, in which the rotation of the motor 80 is transmitted to the rack shaft 97.

As shown in FIG. 1 to FIG. 4, the motor 80 outputs a whole or a part of a torque required for a steering operation. The motor 80 is driven by electric power supplied from batteries 101 and 201 provided as direct current power supplies to rotate the reduction gear 89 in forward and reverse directions. The motor 80 is a three-phase brushless motor and has a rotor 860 and a stator 840.

The motor 80 has a first motor winding 180 and a second motor winding 280. The motor windings 180 and 280 have the same electrical characteristics and are wound about the stator 840 with electrical angles changed from each other by 30 degrees. Correspondingly, phase currents are controlled to be supplied to the motor windings 180 and 280 such that the phase currents have a phase difference φ of 30 degrees. By optimizing the current supply phase difference, the output torque can be improved. In addition, sixth-order torque ripple can be reduced, and noise and vibration can be reduced. In addition, since heat is also distributed and averaged by distributing the current, it is possible to reduce temperature-dependent system errors such as a detection value and torque of each sensor and increase the amount of current that is allowed to be supplied. The motor windings 180 and 280 do not have to be cancel-wound and may have different electrical characteristics.

Hereinafter, a combination of a first inverter unit 120 and a first control unit 150 and the like, which are related to the driving control for the first motor winding 180, is referred to as a first system L1, and a combination of a second inverter unit 220 and a second control unit 250 and the like, which are related to the driving control for the second motor winding 280, is referred to as a second system L2. The structural components related to the first system L1 are basically indicated with reference numerals of 100, and the structural components related to the second system L2 are basically indicated with reference numerals of 200. In the first system L1 and the second system L2, same or similar structural components are indicated with same reference numbers in the least significant two digits. For the other configuration described below, the term "first" is indicated with a suffix "1," and the term "second" is indicated with a suffix "2."

Figure 2:
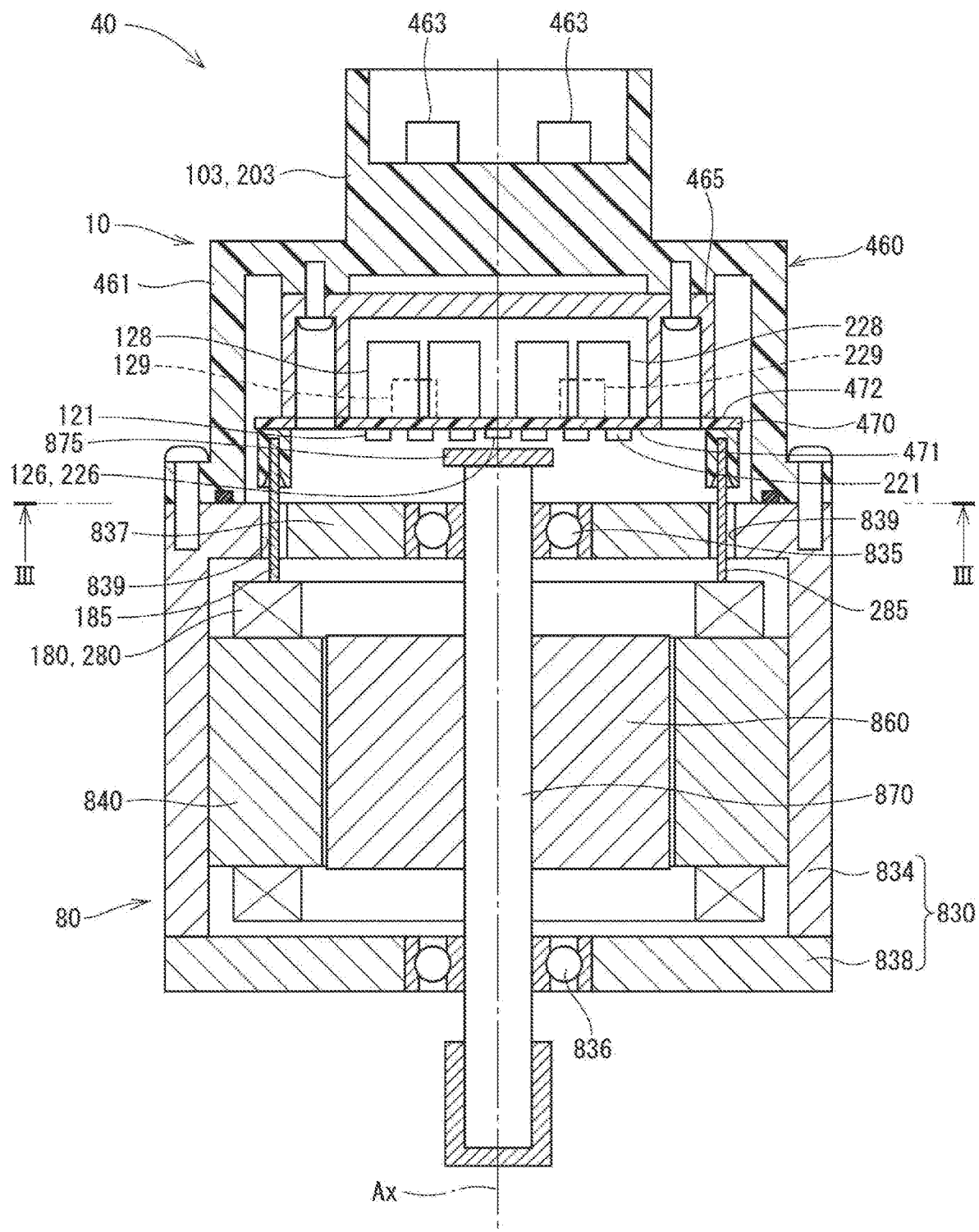
FIG. 2 is a cross sectional view of a driving device according to the first embodiment.

As shown in FIG. 2, in the driving device 40, the ECU 10 is integrally provided on one side in the axial direction of the motor 80 in a machine-electronics integrated type. The motor 80 and the ECU 10 may alternatively be provided separately. The ECU 10 is positioned coaxially with an axis Ax of the shaft 870 on the side opposite to the output shaft of the motor 80. The ECU 10 may alternatively be provided on the output shaft side of the motor 80. By adopting the mechanically-electrically integrated type, it may be possible to efficiently position the ECU 10 and the motor 80 in a vehicle having restriction for mounting space.

The motor 80 includes, in addition to the stator 840 and rotor 860, a housing 830 that houses the stator 840 and the rotor 860, or the like. The stator 840 is fixed to the housing 830 and the motor windings 180 and 280 are wound thereon. The rotor 860 is placed radially inside the stator 840 to be rotatable relative to the stator 840.

The shaft 870 is fitted in the rotor 860 to rotate integrally with the rotor 860. The shaft 870 is rotatably supported by the housing 830 through bearings 835 and 836. The end portion of the shaft 870 on the ECU 10 side protrudes from the housing 830 to the ECU 10 side. A magnet 875 is placed at the end of the shaft 870 on the ECU 10 side.

The housing 830 has a bottomed cylindrical case 834 including a rear end frame 837, and has a front end frame 838 placed on an open side of the case 834. The case 834 and the front end frame 838 are tightly fastened to each other by bolts or the like. Lead wire insertion holes 839 are formed in the rear end frame 837. Lead wires 185 and 285 connected to each phase of the motor windings 180 and 280 are inserted through the lead wire insertion holes 839. The lead wires 185 and 285 are taken out from the lead wire insertion holes 839 to the ECU 10 side and connected to a circuit board 470.

The ECU 10 includes a cover 460 and a heat sink 465 fixed to the cover 460 in addition to the circuit board 470 fixed to the heat sink 465. The ECU 10 further includes various electronic components and the like mounted on the circuit board 470. The cover 460 is provided to protect the electronic components from external impacts and prevent dust, water or the like from entering into the ECU 10. In the cover 460, a cover main body 461 and connector members 103 and 203 are integrally formed. The connector members 103 and 203 may alternatively be separated from the cover main body 461. Terminals 463 of the connector members 103 and 203 are connected to the circuit board 470 via wirings (not shown) or the like. The number of connectors and the number of terminals may be changed in correspondence to the number of signals and the like. The connector members 103 and 203 are provided at the end portion in the axial direction of the driving device 40 and is open on the side opposite to the motor 80.

The circuit board 470 is, for example, a printed circuit board, and is positioned to face the rear end frame 837. On the circuit board 470, the electronic components of the first and second systems are mounted independently for each system so that the two systems are provided in a fully redundant configuration. According to the present embodiment, the electronic components are mounted on one circuit board 470. The electronic components may alternatively be mounted on plural circuit boards.

Figure 3:
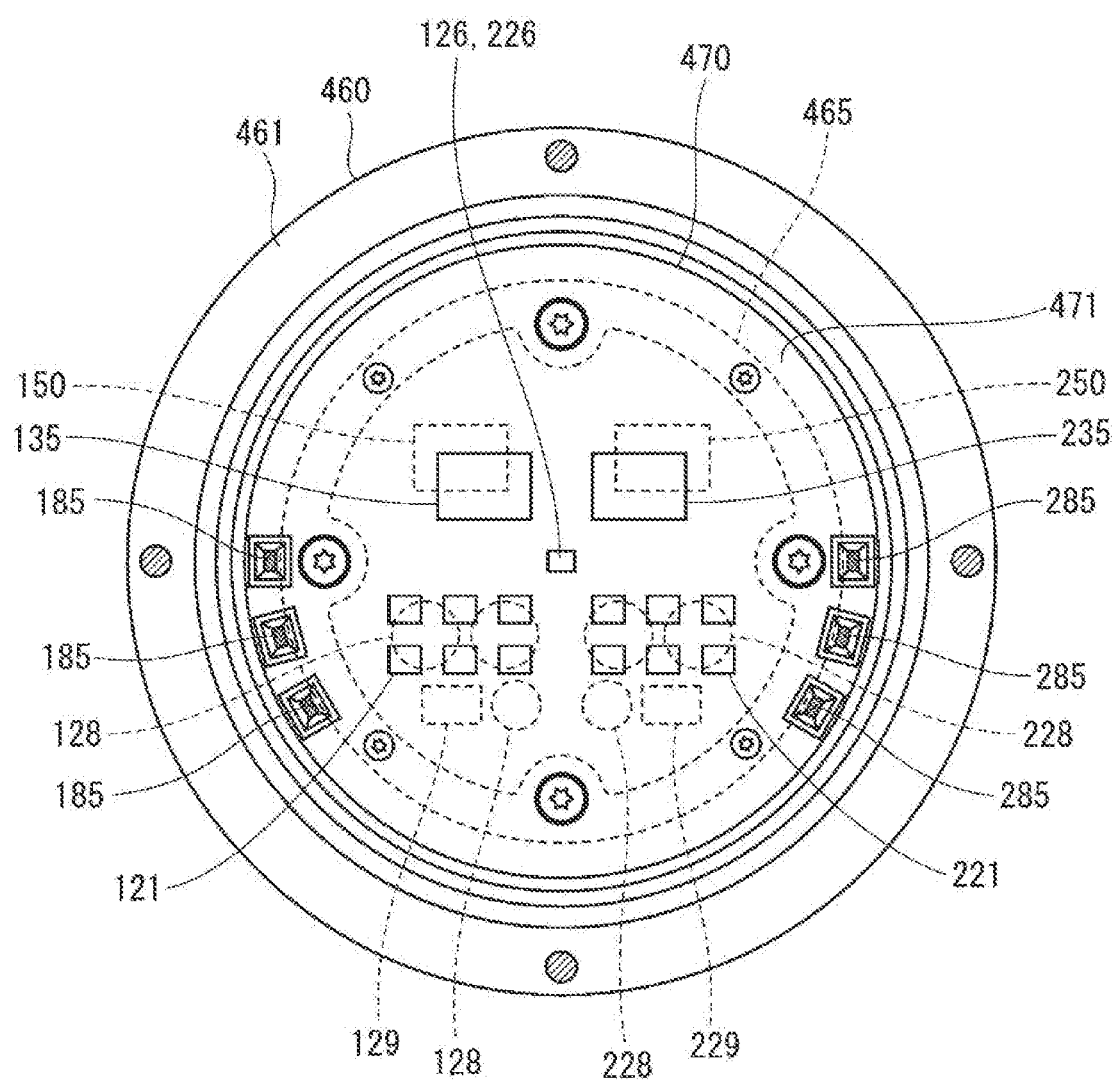
FIG. 3 is a cross sectional view taken along the line III-III of FIG. 2.

Of the two principal surfaces of the circuit board 470, one surface on the side of the motor 80 is referred to as a motor-side surface 471 and the other surface opposite from the motor 80 is referred to as a cover-side surface 472. As shown in FIG. 3, switching elements 121 configuring the inverter unit 120, switching elements 221 configuring the inverter unit 220, rotation angle sensors 126, 226, custom ICs 135, 235 and the like are mounted on the motor-side surface 471. The angle sensors 126 and 226 are mounted at positions facing the magnet 875 to be able to detect a change in the magnetic field caused by the rotation of the magnet 875.

On the cover-side surface 472, capacitors 128, 228, inductors 129, 229, and microcomputers forming the control units 150, 250 are mounted. In FIG. 3, reference numerals 150 and 250 are assigned to the microcomputers provided as the control units 150 and 250, respectively. The capacitors 128 and 228 smoothen electrical power input from the batteries 101 and 201. The capacitors 128 and 228 assist electric power supply to the motor 80 by storing electric charge therein. The capacitors 128, 228 and the inductors 129, 229 configure filter circuits, respectively, to reduce noises transmitted from other devices which share the battery, and also to reduce noises transmitted to other devices, which share the battery, from the driving device 40. Although not shown in FIG. 3, power supply relays 122, 222, the motor relays 125, 225, current sensors 127, 227 and the like are also mounted on the motor-side surface 471 or the cover-side surface 472.

Figure 4:
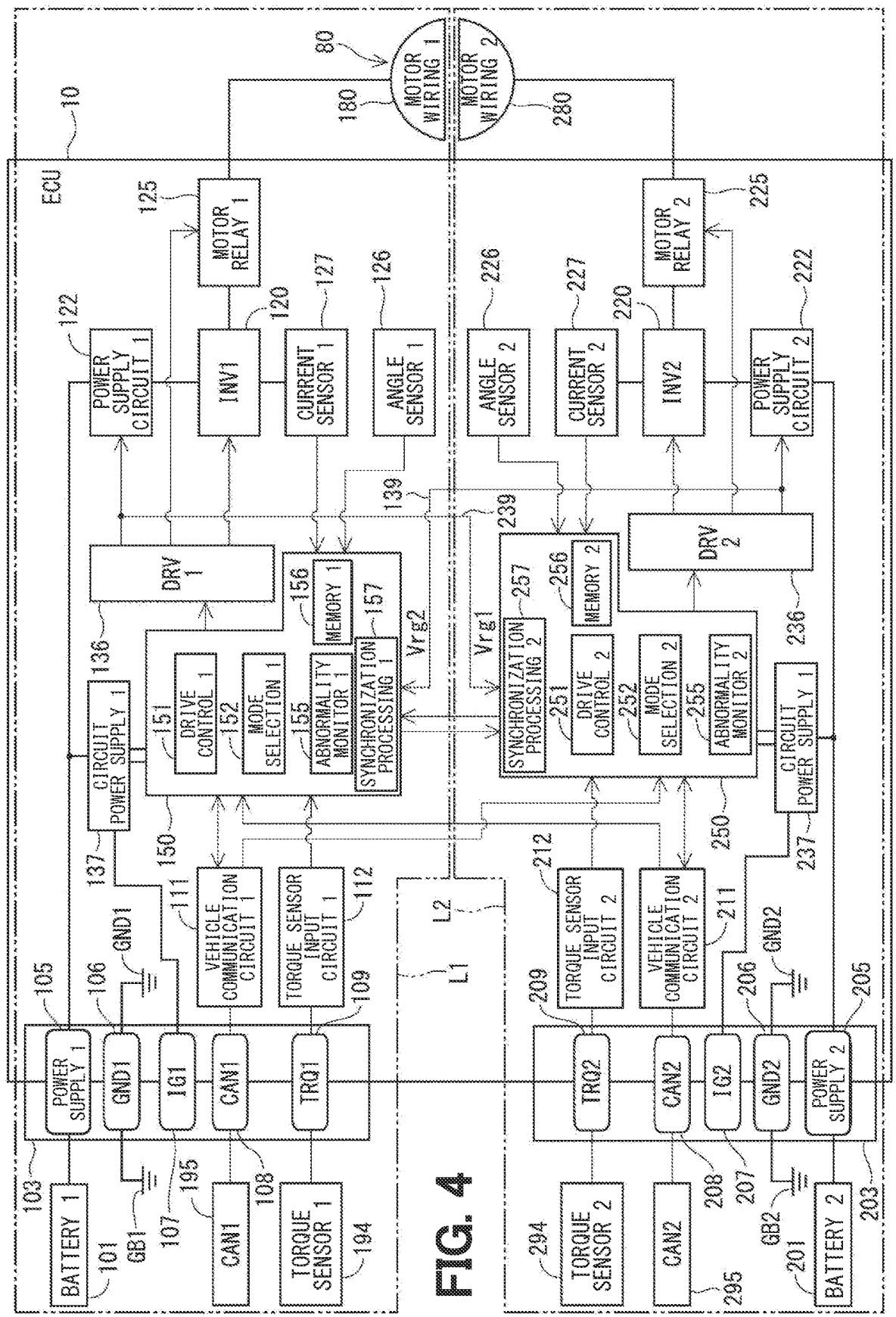
FIG. 4 is a block diagram showing an ECU according to the first embodiment.

As shown in FIG. 4, the ECU 10 includes the inverter units 120, 220, the control units 150, 250 and the like. The ECU 10 is provided with the connector members 103 and 203. The first connector member 103 is provided with a first power supply terminal 105, a first ground terminal 106, a first IG terminal 107, a first communication terminal 108, and a first torque terminal 109.

The first power supply terminal 105 is connected to the first battery 101 via a fuse (not shown). The electric power supplied from the positive electrode of the first battery 101 via the first power supply terminal 105 is supplied to the first motor winding 180 via the power supply relay 122, the inverter unit 120, and the motor relay 125. The first ground terminal 106 is connected to a first ground GND1 that is a first system ground inside the ECU 10 and a first external ground GB1 that is a first system ground outside the ECU 10. In a vehicle system, a metal chassis body is a common GND plane. The first external ground GB1 indicates one of the connection points on the GND plane. The negative electrode of the second battery 201 is also connected to the connection point on the GND plane.

The first IG terminal 107 is connected to the positive electrode of the first battery 101 via a first switch that is on/off-controlled in conjunction with a vehicle start switch such as an ignition (IG) switch. The electric power supplied from the first battery 101 via the first IG terminal 107 is supplied to the first custom IC 135.

The first custom IC 135 includes a first driving circuit 136, a first circuit power supply 137, a microcomputer monitor (not shown), a current monitor amplifier (not shown), and the like.

The first communication terminal 108 is connected to a first vehicle communication circuit 111 and a first vehicle communication network 195. The first vehicle communication network 195 and the first control unit 150 are connected via the first vehicle communication circuit 111 so that signal transmission and reception are performed. Further, the first vehicle communication network 195 and the second control unit 250 are connected to be able to receive information. Thus, even in case the second control unit 250 fails to operate normally, the first vehicle communication network 195 including the first control unit 150 is not affected.

The first torque terminal 109 is connected to the first sensor unit 194 of the torque sensor 94. The detection value of the first sensor unit 194 is input to the first control unit 150 via the first torque terminal 109 and the first torque sensor input circuit 112. Here, the first sensor unit 194 and the first control unit 150 are configured such that a failure of this torque sensor input circuit system is detected.

The second connector unit 203 is provided with a second power supply terminal 205, a second ground terminal 206, a second IG terminal 207, a second communication terminal 208, and a second torque terminal 209. The second power supply terminal 205 is connected to the positive electrode of the second battery 201 via a fuse (not shown). The electric power supplied from the positive electrode of the second battery 201 via the second power supply terminal 205 is supplied to the second motor winding 280 via the power supply relay 222, the inverter unit 220, and the motor relay 225. The second ground terminal 206 is connected to a second ground GND2 that is a second system ground inside the ECU 10 and a second external ground GB2 that is a second system ground outside the ECU 10. In the vehicle system, the metal chassis body is the common GND plane. The second external ground GB2 indicates one of the connection points on the GND plane. The negative electrode of the second battery 201 is also connected to this connection point on the GND plane. Here, at least different systems are configured not to connect to the same connection point on the GND plane.

The second IG terminal 207 is connected to the positive electrode of the second battery 201 via a second switch that is on/off-controlled in conjunction with the start switch of the vehicle. The electric power supplied from the second battery 201 via the second IG terminal 207 is supplied to the second custom IC 235. The second custom IC 235 includes a second driving circuit 236, a second circuit power supply 237, a microcomputer monitor (not shown), a current monitor amplifier (not shown), and the like.

The second communication terminal 208 is connected to a second vehicle communication circuit 211 and a second vehicle communication network 295. The second vehicle communication network 295 and the second control unit 250 are connected to be capable of signal transmission and reception via the second vehicle communication circuit 211. Further, the second vehicle communication network 295 and the first control unit 150 are connected to be able to receive information. Thus, even in case the first control unit 150 fails to operate normally, the second vehicle communication network 295 including the second control unit 250 is not affected.

The second torque terminal 209 is connected to the second sensor unit 294 of the torque sensor 94. The detection value of the second sensor unit 294 is input to the second control unit 250 via the second torque terminal 209 and the second torque sensor input circuit 212. Here, the second sensor unit 294 and the second control unit 250 are configured such that a failure of this torque sensor input circuit system is detected.

In FIG. 4, the communication terminals 108 and 208 are connected to separate vehicle communication networks 195 and 295, respectively, but may be connected to a same vehicle communication network. Regarding the vehicle communication networks 195 and 295 in FIG. 4, CAN (controller area network) is exemplified. However, any other communication standard such as CAN-FD (CAN with flexible data rate) or FlexRay may be employed.

The first inverter unit 120 is a three-phase inverter having switching elements 121 and converts electric power for the first motor winding 180. The second inverter unit 220 is a three-phase inverter having switching elements 221 and converts electric power for the second motor winding 280.

The first power supply relay 122 is provided between the first power supply terminal 105 and the first inverter unit 120. The first motor relay 125 is provided in each phase between the first inverter unit 120 and the first motor winding 180. The second power supply relay 222 is provided between the second power supply terminal 205 and the second inverter unit 220. The second motor relay 225 is provided in each phase between the second inverter unit 220 and the second motor winding 280.

Figure 5:
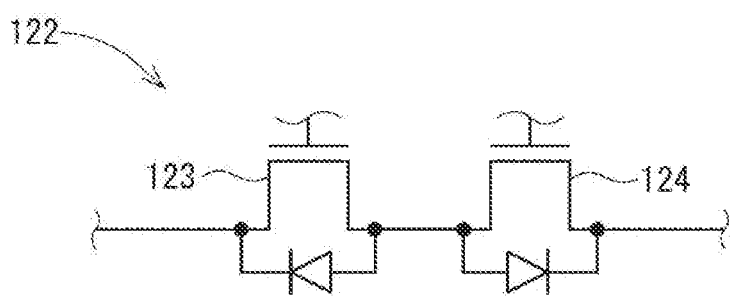
FIG. 5 is a circuit diagram showing a power supply relay according to the first embodiment.

In the present embodiment, the switching elements 121, 221, the power supply relays 122, 222, and the motor relays 125, 225 are all MOSFETs, but other elements such as IGBTs may alternatively be used. As shown in FIG. 5, in case that the first power supply relay 122 is configured by an element such as a MOSFET having a parasitic diode, two switching elements 123 and 124 are connected preferably in series so that the direction of the parasitic diode is reversed. The second power supply relay 222 is configured in the same way, although not shown. Thereby, even when the batteries 101 and 201 are erroneously connected in the reverse direction, it is possible to prevent a reverse current from flowing. Further, the power supply relays 122 and 222 may be mechanical relays.

As shown in FIG. 4, on/off operations of the first switching element 121, the first power supply relay 122 and the first motor relay 125 are controlled by the first control unit 150. On/off operations of the second switching element 221, the second power supply relay 222 and the second motor relay 225 are controlled by the second control unit 250.

The first angle sensor 126 detects the rotation angle of the motor 80 and outputs the detection value to the first control unit 150. The second angle sensor 226 detects the rotation angle of the motor 80 and outputs the detection value to the second control unit 250. The first angle sensor 126 and the first control unit 150, and the second angle sensor 226 and the second control unit 250 are configured such that a failure of each angle sensor input circuit system is detected.

The first current sensor 127 detects a current that is supplied to each phase of the first motor winding 180. The detection value of the first current sensor 127 is amplified by an amplifier circuit in the custom IC 135 and output to the first control unit 150. The second current sensor 227 detects a current that is supplied to each phase of the second motor winding 280. The detection value of the second current sensor 227 is amplified by an amplifier circuit in the custom IC 235 and output to the second control unit 250.

The first driver circuit 136 outputs driving signals to each element for driving the first switching element 121, the first power supply relay 122 and the first motor relay 125 based on control signals from the first control unit 150. The second driver circuit 236 outputs driving signals to each element for driving the second switching element 221, the second power supply relay 222 and the second motor relay 225 based on control signals from the second control unit 250.

The circuit power supply 137 is connected to the power supply terminal 105 and the IG terminal 107 and supplies power to the first control unit 150. The circuit power supply 237 is connected to the power supply terminal 205 and the IG terminal 207 and supplies power to the second control unit 250.

Each of the control units 150 and 250 is mainly composed of a microcomputer and the like, and internally includes, although not shown in the figure, a CPU, a ROM, a RAM, an I/O, a bus line for connecting these components, and the like. Each process executed by each of the control units 150 and 250 may be a software process or may be a hardware process. The software process may be implemented by causing the CPU to execute a program. The program may be stored beforehand in a memory device such as a ROM, that is, in a computer-readable, non-transitory, tangible storage medium. The hardware process may be implemented by a special purpose electronic circuit. In the present embodiment, each of the first control unit 150 and the second control unit 250 is configured such that, for example, a locked-step dual microcomputer or the like is used to be able to detect its own failure.

The first control unit 150 includes a drive control unit 151, a mode selection unit 152, an abnormality monitor unit 155, a storage unit 156, and a synchronization processing unit 157. The drive control unit 151 controls current supply to the first motor winding 180 by controlling the on/off operation of the first switching element 121. The drive control unit 151 controls the on/off operations of the first power supply relay 122 and the first motor relay 125.

The second control unit 250 includes a drive control unit 251, a mode selection unit 152, an abnormality monitor unit 255, a storage unit 256, and a synchronization processing unit 257. The drive control unit 251 controls current supply to the second motor winding 280 by controlling the on/off operation of the second switching element 221. The drive control unit 251 controls the on/off operations of the second power supply relay 222 and the second motor relay 225. The drive control units 151 and 251 control the drive of the motor 80 by current feedback control, for example, but the control method to be used in the motor control may be other than the current feedback control.

The mode selection units 152 and 252 select a drive mode related to drive control of the motor 80. The drive modes of the present embodiment include a cooperative drive mode, an independent drive mode, and a single-system drive mode. Normally, the drive of the motor 80 is controlled by the cooperative drive mode. Here, normally means that the systems L1 and L2 are normal and the two systems can be cooperatively driven, and the control in the cooperative drive mode in the normal time is appropriately referred to as "normal control". In the present embodiment, a case where communication between microcomputers is abnormal or synchronization between systems is not possible is regarded as an incoordination abnormality. Regarding the determination of incoordination abnormality, either communication between microcomputers or synchronization between systems may be omitted. Hereinafter, it is assumed that the synchronization between systems is normal, and the processing according to the communication state between microcomputers will be described.

In the cooperative drive mode, when the control units 150 and 250 are both normal and the inter-computer communication between the microcomputers is normal, at least one value is shared between the systems so that the respective systems cooperate to drive the motor 80. In this embodiment, the current command value, the current detection value, and the current limit value are shared as the control information. In the present embodiment, the first control unit 150 is referred to as a master control unit and the second control unit 250 is referred to as a slave control unit. The current command value calculated by the first control unit 150, as the master, is transmitted to the second control unit 250. Then, the same current command value calculated by the first control unit 150 is used by the control units 150 and 250. The shared current command value may be a value after current limitation or a value before current limitation. In the present embodiment, in the cooperative drive mode, current control is performed by a sum-and-difference control that controls a current sum and a current difference of the two systems.

In the independent drive mode, each system independently controls the drive of the motor 80 by two systems without using the control information of the other system. In the one-system drive mode, the drive of the motor 80 is controlled by one system by stopping the other system and without using the control information of the other system. Here, it is noted that, even if there are three or more systems, the drive mode for driving the motor 80 by one system is referred to as the one-system mode.

Figure 6:
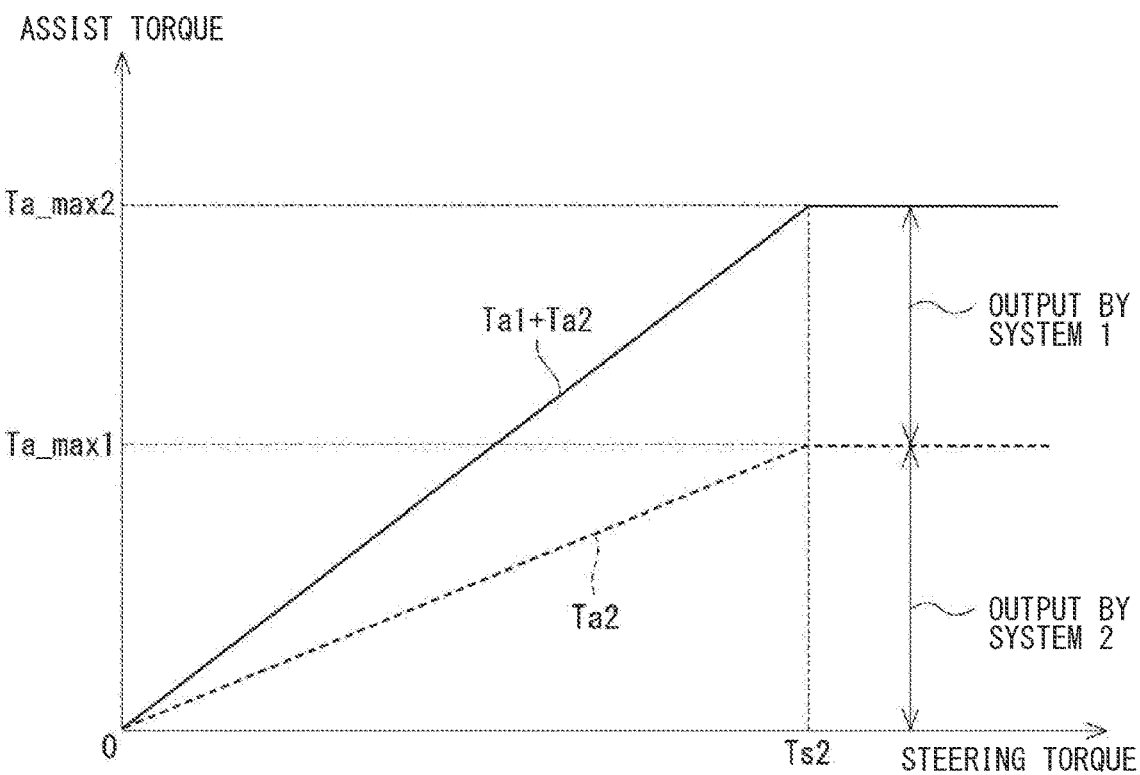
FIG. 6 is an explanatory diagram showing a relationship between steering torque and assist torque during driving of two systems according to the first embodiment.

The output characteristics in each drive mode will be described with reference to FIGS. 6 and 7. In the present embodiment, an assist torque Ta, which is the output torque output from the motor 80, is set according to a steering torque Ts. In FIG. 6, the horizontal axis is the steering torque Ts, the vertical axis is the assist torque Ta, and in the cooperative drive mode and the independent drive mode, the total output of the two systems is shown by a solid line, and the output of the first system L1 is shown by a broken line.

As shown in FIG. 6, the assist torque Ta increases as the steering torque Ts increases proportionally in a range where the steering torque Ts reaches an upper limit value Ts2, and remains constant at an output upper limit value Ta_max2 in a range where the steering torque Ts exceeds the upper limit value Ts2. When the performance and the like are the same between the first system L1 and the second system L2, the first system L1 and the second system L2 are responsible for the output of the motor 80 by ½. That is, the output upper limit value Ta_max1 in one system is ½ of the output upper limit value Ta_max2 in two systems. Further, the rate of increase of the assist torque Ta with respect to the steering torque Ts in one system is ½ of that in the case of driving two systems. Here, when driving with one system in the independent drive mode, the assist torque Ta is halved when driving with two systems, as shown by the broken line. In FIG. 6, the assist torque Ta linearly increases with the increase of the steering torque Ts in the range up to the output upper limit value Ta_max2, but may increase non-linearly.

Figure 7:
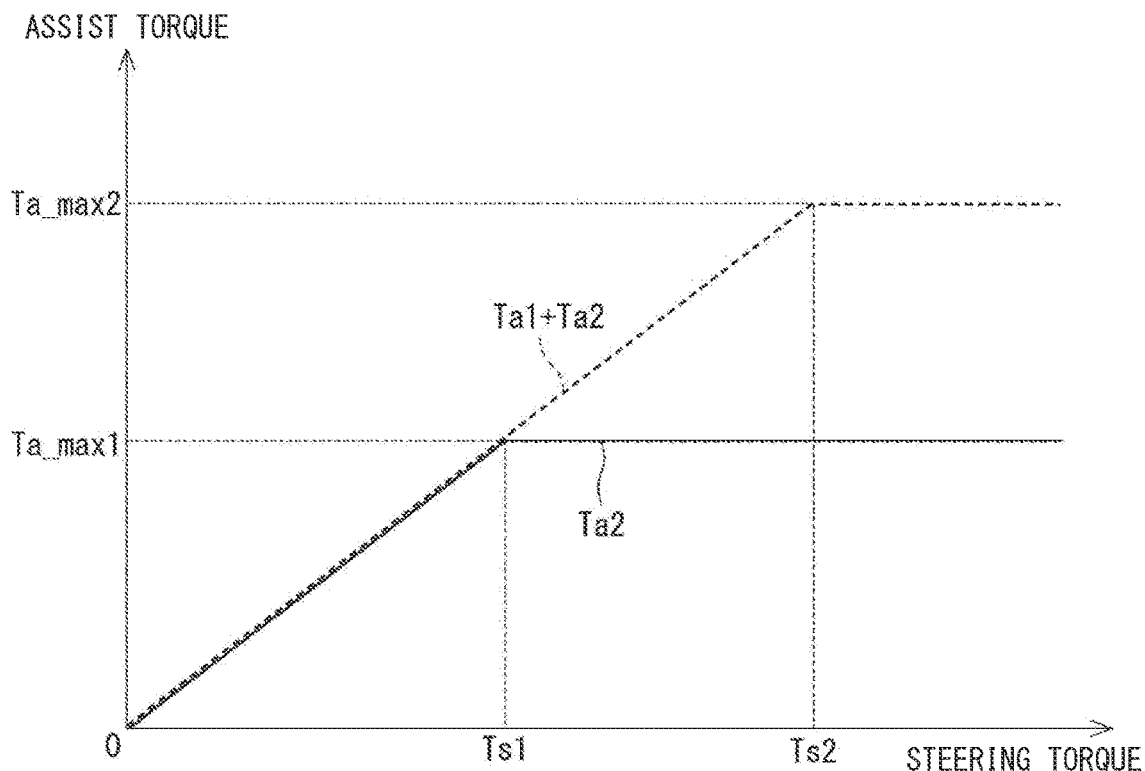
FIG. 7 is an explanatory diagram showing the relationship between the steering torque and the assist torque in one-system drive mode according to the first embodiment.

The output characteristics in the single system drive mode are shown in FIG. 7. In FIG. 7, the output when one system is driven in the second system L2 is shown by a solid line, and the total output of the two systems in the normal state is shown by a broken line. In the one-system drive mode, an increase rate of the assist torque Ta relative to the steering torque Ts is doubled so that the assist torque Ta relative to the steering torque Ts is the same as that in the case of driving two systems. Further, in the range where the steering torque Ts is larger than the upper limit value Ts1, the assist torque Ta is maintained constant at the same as the output upper limit value Ta_max1 in the one-side drive mode regardless of the steering torque Ts. This assist torque Ta is smaller than that in the case of driving two systems. When there is a margin in the rated current or the like, the output upper limit value Ta_max1 in the one-system drive mode may be increased within the range of the output upper limit value Ta_max2 or less in the case of driving two systems. Hereinafter, the one-system drive performed when another system is abnormal is referred to as "backup control" and is also described as "BU control" in the figure. Further, in the backup control, changing the output characteristic and increasing the rate of increase of the assist torque Ta with respect to the steering torque Ts and increasing at least one of the output upper limits is referred to as "increasing the output".

As shown in FIG. 4, the abnormality monitor unit 155 monitors the abnormality of the first system L1 which is its own system. Further, when an abnormality occurs that should stop the own system, the first control unit 150 turns off at least one of the first inverter unit 120, the first power supply relay 122 and the first motor relay 125.

The abnormality monitor unit 155 monitors a state of communication with the second control unit 250 and an operation state of the second system L2. As a method for monitoring the operation state of the second system L2, it is checked whether an emergency stop has occurred by monitoring at least one state of a circuit (for example, the second inverter unit 220, the second power supply relay 222 and the second motor relay 225), which stops the own system when an abnormality in the second system L2 is detected, or a signal line related to the inter-computer communication. In the present embodiment, an other system relay monitor circuit 139 is provided to acquire a second relay gate signal Vrg2 output from the second driver circuit 236 to the second power supply relay 222, and monitor the state of the second power supply relay 222 based on the second relay gate signal Vrg2.

The abnormality monitor unit 255 monitors an abnormality of the second system L2 which is its own system. Further, when an abnormality occurs that should stop the own system, the second control unit 250 turns off at least one of the second inverter unit 220, the second power supply relay 222 and the second motor relay 225.

The abnormality monitor unit 255 monitors a state of communication with the first control unit 150 and an operation state of the first system L1. As a method for monitoring the operation state of the first system L1, it is checked whether an emergency stop has occurred by monitoring at least one state of a circuit (for example, the first inverter unit 120, the first power supply relay 122 and the first motor relay 125), which stops the own system when an abnormality in the first system L1 is detected, or a signal line related to the inter-computer communication. In the present embodiment, an other system relay monitor circuit 239 is provided to acquire a first relay gate signal Vrg1 output from the first driver circuit 136 to the first power supply relay 122, and monitor the state of the first power supply relay 122 based on the first relay gate signal Vrg1.

In the monitoring of the first system L1 in the second control unit 250, the relay gate signal Vrg1 used as the other system relay information may be replaced with an intermediate voltage between the two elements 123 and 124 configuring the power supply relay 122, a relay drive signal output from the control unit 150 or a relay output-side voltage developed between the power supply relay 122 and the inverter unit 120. The same applies to the monitoring of the second system L2 in the first control unit 150.

Hereinafter, the information acquired from the other system relay monitor circuit is referred to as other system relay information, monitoring of the operation state of the other system based on the other system relay information is referred to as an other system relay monitoring, and the monitored relay is referred to as an other system relay. Further, a state in which the other system relay is turned on is referred to as "other system relay Hi", and a state in which the other system relay is turned off is referred to as "other system relay Lo".

The abnormality monitor units 155 and 255 determine that the other system is abnormal when the communication abnormality between the microcomputers has occurred and the relay information of the other system is abnormal. Further, the abnormality monitor units 155 and 255 determine that the control unit of the other system is normal and the inter-computer communication abnormality is present, when the inter-computer communication abnormality is present and the relay information of the other system is normal. That is, in the present embodiment, by the communication state between microcomputers and the relay monitoring of other system, it is determined whether the state in which communication is not possible is due to an abnormality in the control unit of the other system or due to an abnormality in communication between microcomputers.

The storage unit 156 is a non-volatile memory, and stores abnormality information related to the abnormality detected by the abnormality monitor unit 155. The storage unit 256 is a non-volatile memory, and stores abnormality information related to the abnormality detected by the abnormality monitor unit 255. The abnormality information stored in the storage units 156 and 256 includes information related to communication abnormality between microcomputers, information related to other system stoppage, and the like. The abnormality information stored in the storage units 156 and 256 is used for abnormality analysis. Hereinafter, the abnormality information will be referred to as "diag" as appropriate.

The synchronization processing units 157 and 257 perform synchronization processing for synchronizing the control timings of the control units 150 and 250. The first control unit 150 has a clock generation circuit (not shown), and generates drive timing based on the generated clock signal. The synchronization processing unit 157 generates a synchronization signal for synchronizing the drive timing with the other system, and transmits the synchronization signal to the second control unit 250.

The second control unit 250 has a clock generation circuit (not shown), and generates drive timing based on the generated clock signal. The synchronization processing unit 257 corrects the drive timing so that the drive timing matches with the drive timing of the first system L1 based on the synchronization signal transmitted from the first control unit 150. The synchronization signal may be generated outside the control units 150 and 250, and the details of the synchronization processing may be different. Further, as the communication line used for transmitting and receiving the synchronization signal, a dedicated communication line may be used, or a signal line used for transmitting and receiving other information may be shared.

The state in which communication cannot be performed between the control units 150 and 250 may occur not only due to an internal failure of the ECU 10, but also due to an abnormality of the external power supply device of the ECU 10 such as an abnormality of the batteries 101 and 201 and a disconnection of the harness. In the present embodiment, since the cooperative drive is performed using the information of the other system acquired by the communication between the microcomputers, it is desirable to promptly switch the drive mode when the communication between the microcomputers is abnormal. On the other hand, if the abnormality information is stored, as a diagnostic storage, at the same time as the drive mode is switched, the abnormality history remains even if it is a temporary abnormality such as a momentary power interruption.

Figure 17:
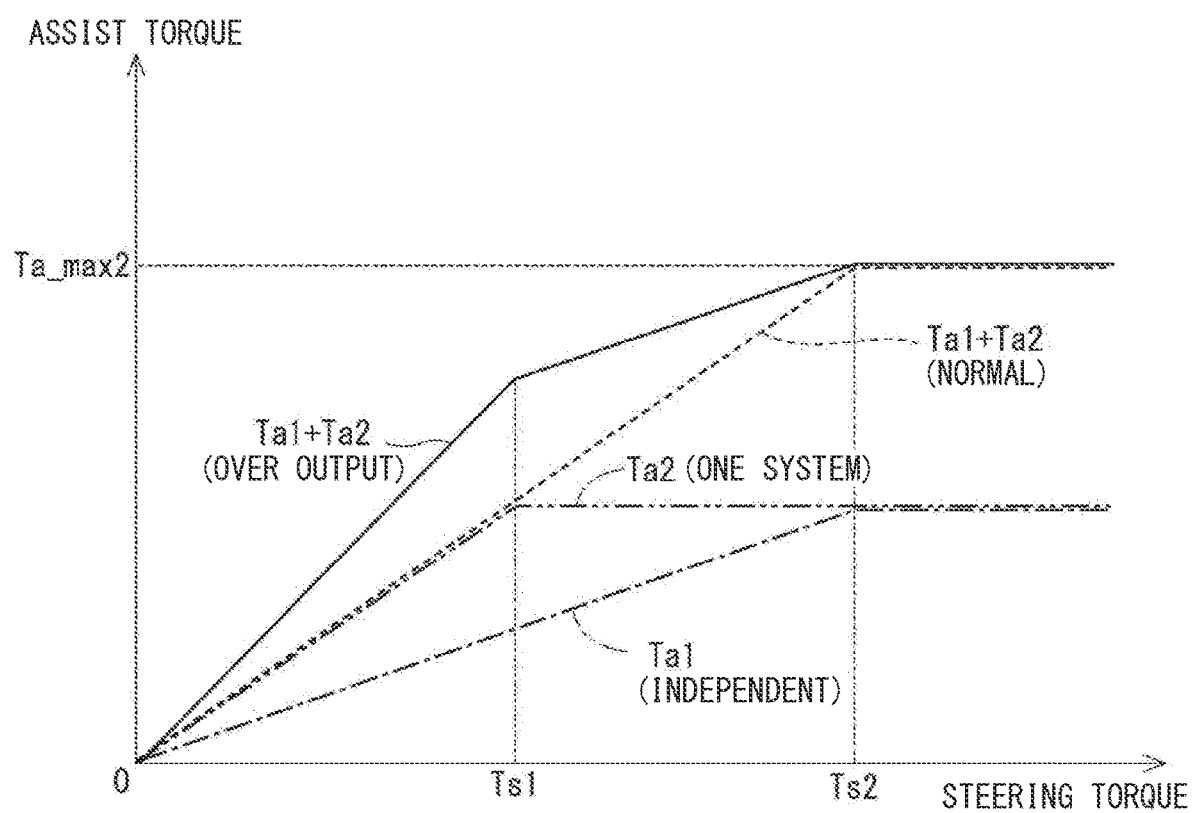
FIG. 17 is an explanatory diagram showing a relationship between steering torque and assist torque according to a reference example.

In addition, if the output characteristics are changed by backup control, there is a risk of excessive output when the system in which a temporary abnormality has occurred is restored. As shown in FIG. 17, as a reference example, when one system drive is already performed in the second system L2 and the output due to the independent drive of the first system L1 is added. In this case, the output becomes higher than usual in the range in which the steering torque Ts reaches the upper limit value Ts2. In FIG. 17, the output of the two systems in the cooperative drive mode is shown by a broken line, the output of the second system L2 in the one-system drive mode is shown by a two-dot chain line, the output of the first system L1 in the independent drive mode is shown by a one-dot chain line, and the output of the two systems in which the output of the second system L2 is added to the output of the first system L1 in the one-system drive mode is shown by a solid line.

In the present embodiment, when an abnormality in communication between microcomputers occurs, the drive mode is changed by confirming the abnormality as a first stage, and diagnostic storage is performed by confirming the abnormality as a second stage. The time for confirming the abnormality as the first stage is different from the time for confirmation the abnormality as the second stage. Specifically, the abnormality confirmation time (for example, 3 [s]) of the second stage is made longer than the abnormality confirmation time (for example, several [ms]) of the first stage. It is preferable that the abnormality confirmation time of the first stage is as short as possible, and the abnormality confirmation time of the second stage is set according to the time required for restarting by resetting the microcomputer of the other system. In detail, the abnormality as the second stage is set to a time longer than the time required for restarting by the amount of time allowed as a power interruption. Also, when the other system has already shifted to the backup control, excessive output is prevented by stopping the assist of the own system. Further, in the present embodiment, the time until the other system stop confirmation determination is made is equal to the abnormality confirmation time in the second stage.

Figure 8:
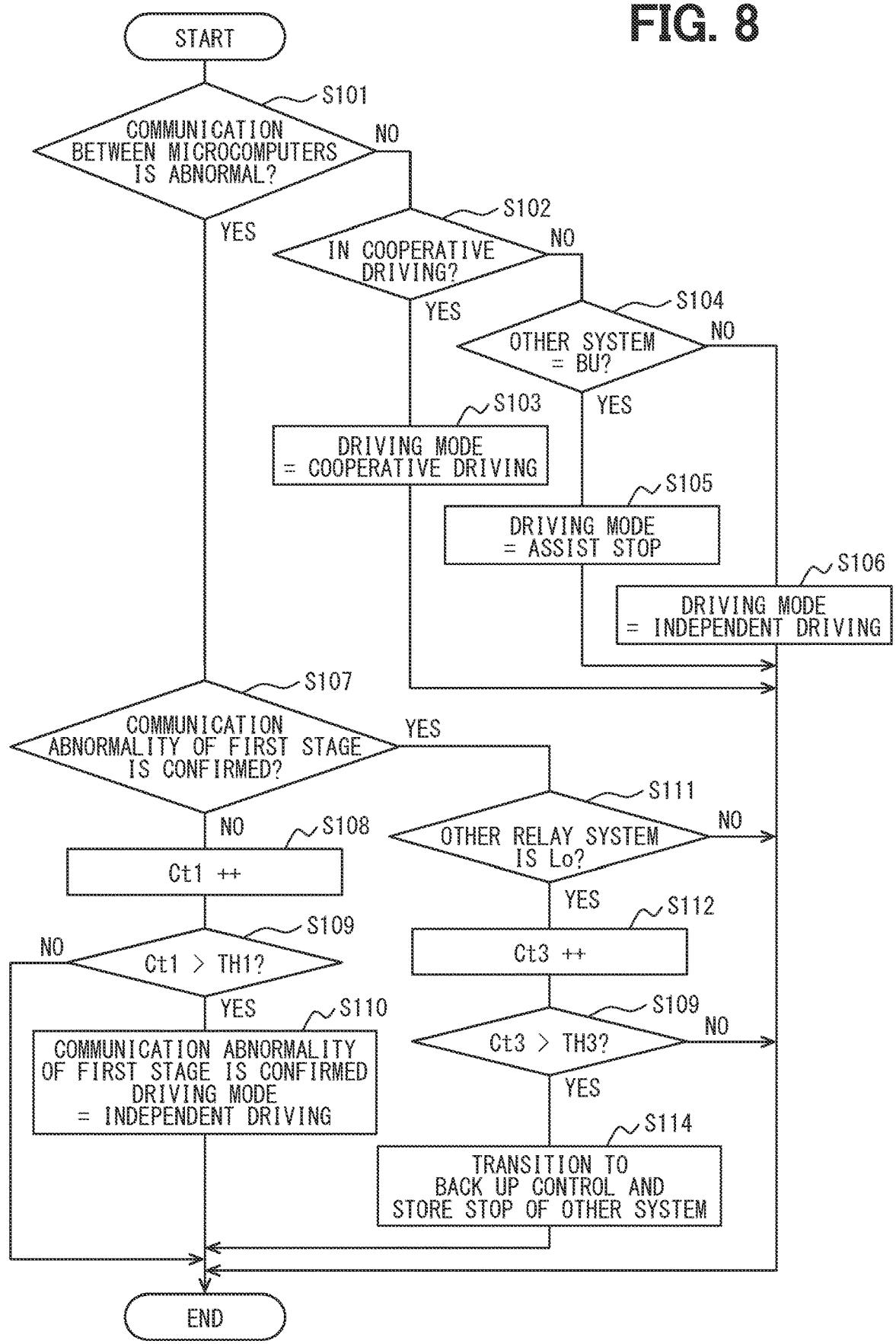
FIG. 8 is a flowchart showing a drive mode selection process according to the first embodiment.

This drive mode selection process in the present embodiment will be described with reference to a flowchart of FIG. 8. This process is executed by the control units 150 and 250 at a predetermined cycle. Hereinafter, the "step" in step S101 is omitted and is simply referred to as the symbol "S". The other steps are the same.

In S101, the control units 150 and 250 determine whether or not the communication between the microcomputers is abnormal. In case it is determined that the inter-microcomputer communication abnormality has occurred (S101: YES), the process proceeds to S107. When it is determined that the communication between the microcomputers is normal (S101: NO), the process proceeds to S102. When the communication between the microcomputers is normally determined and counters Ct1, Ct2, and Ct3 described later are counted, the counters Ct1, Ct2, and Ct3 are reset.

In S102, the control units 150 and 250 determine whether or not cooperative driving is in progress. When it is determined that the cooperative drive is in progress (S102: YES), the process proceeds to S103 and the cooperative drive is continued. When it is determined that the cooperative drive is not in progress (S102: NO), the process proceeds to S104.

In S104, the control units 150 and 250 determine whether the other system has shifted to the backup control. When it is determined that the other system has shifted to the backup control (S104: YES), the process proceeds to S105, and the drive mode is set to assist stop. When it is determined that the other system has not shifted to the backup control (S104: NO), the process proceeds to S106, and the drive mode of the own system is set to the independent drive mode.

In S107, which shifts to the case where it is determined that the communication between the microcomputers is abnormal (S101: YES), the control units 150 and 250 determine whether or not the communication abnormality in the first stage is confirmed. When it is determined that the communication abnormality in the first stage is confirmed (S107: YES), the process proceeds to S111. When it is determined that the communication abnormality in the first stage is not confirmed (S107: NO), the process proceeds to S108, and the communication abnormality counter Ct1 of the first stage is incremented.

In S109, the control units 150 and 250 determine whether or not the first-stage communication abnormality counter Ct1 is larger than the first-stage confirmation determination value TH1. The first-stage confirmation determination value TH1 is set according to the first-stage abnormality confirmation time. When it is determined that the first-stage communication abnormality counter Ct1 is equal to or less than the first-stage confirmation determination value TH1 (S109: NO), the process of S110 is not performed and this routine is terminated. When it is determined that the first-stage abnormality confirmation counter Ct1 is greater than the first-stage confirmation determination value TH1 (S109: YES), the process proceeds to S110, the first-stage communication abnormality is confirmed, and the drive mode is set to the independent drive mode. For example, the first-stage confirmation determination value TH1 may be set to 0, and the mode may be shifted to the independent drive mode immediately after the communication abnormality between the microcomputers is detected.

In S111, which shifts to the case where it is determined that the communication abnormality in the first stage is confirmed (S107: YES), the control units 150 and 250 determine whether or not the other system relay is Lo. When it is determined that the other system relay is Hi (S111: NO), the processing after S113 is not performed, and this routine is terminated. When the other system monitoring counter Ct3 is counted, it is reset. When it is determined that the other system relay is Lo (S111: YES), the process proceeds to S112 and the other system monitoring counter Ct3 is incremented.

In S113, the control units 150 and 250 determine whether or not the other system monitoring counter Ct3 is greater than the other system abnormality confirmation determination value TH3. The other system abnormality confirmation determination value TH3 is set according to the time for shifting from the independent drive to the backup control. When it is determined that the other system monitoring counter Ct3 is equal to or less than the other system abnormality confirmation determination value TH3 (S113: NO), the processing of S114 is not performed and this routine is terminated. When it is determined that the other system monitoring counter Ct3 is greater than the other system abnormality confirmation determination value TH3 (S113: YES), the process proceeds to S114, and the process shifts to the backup control. Further, the other system stop is stored in the storage unit 156, 256 as a diagnosis.

The diagnostic storage process of this embodiment will be described with reference to the flowchart of FIG. 9. This process is executed by the control units 150 and 250 at a predetermined cycle. In S151, the control units 150 and 250 determine whether or not the communication between the microcomputers is abnormal. When it is determined that the communication between the microcomputers is normal (S151: NO), the processing after S152 is not performed. When the second-stage abnormality confirmation counter Ct2, which will be described later, is counted, it is reset. In case it is determined that the communication between the microcomputers is abnormal (S151: YES), the process proceeds to S152.

In S152, the control units 150 and 250 determine whether or not the communication abnormality in the first stage is confirmed. When it is determined that the communication abnormality in the first stage has not been confirmed (S152: NO), the processing after S152 is not performed, and this routine is terminated. When it is determined that the communication abnormality in the first stage is confirmed (S152: YES), the process proceeds to S153.

In S153, the control units 150 and 250 determine whether or not the own system is in the backup control. When it is determined that the own system is in the backup control (S153: YES), the processing after S154 is not performed, and this routine is terminated. When it is determined that the own system is not in the backup control (S153: NO), the process proceeds to S154.

In S154, the control units 150 and 250 determine whether or not the power latch is in progress. The control units 150 and 250 continue to be on even after the start switch is turned off, perform end processing and the like, and then turn off after the end processing is completed. In the present embodiment, the state in which the control units 150 and 250 are turned on after the start switch is turned off is defined as "power latch". When it is determined that the power latch is in progress (S154: YES), the processing after S155 is not performed, and this routine is terminated. When it is determined that the power latch is not in progress (S154: NO), the process proceeds to S155.

In S155, the control units 150 and 250 determine whether or not the other system relay is Lo. When it is determined that the other system relay is Lo (S155: YES), the processing after S156 is not performed, and this routine is terminated. When it is determined that the other system relay is Hi (S155: NO), the process proceeds to S156.

In S156, the control units 150 and 250 increment the second-stage communication abnormality counter Ct2. In S157, it is determined whether or not the second-stage communication abnormality counter Ct2 is greater than the second-stage confirmation determination threshold value TH2. In the present embodiment, the second-stage confirmation determination value TH2 is set according to the second-stage abnormality confirmation time, and is the same value as the other system abnormality confirmation determination value TH3. When it is determined that the second-stage communication abnormality counter Ct2 is equal to or less than the second-stage confirmation determination value TH2 (S157: NO), the process of S158 is not performed and this routine is terminated. When it is determined that the second-stage communication abnormality counter Ct2 is greater than the second-stage confirmation judgment value TH2 (S157: YES), the process proceeds to S158 to confirm the second-stage communication abnormality and store the communication abnormality between microcomputers as the diagnostic to the storage units 156 and 256.

Figure 9:
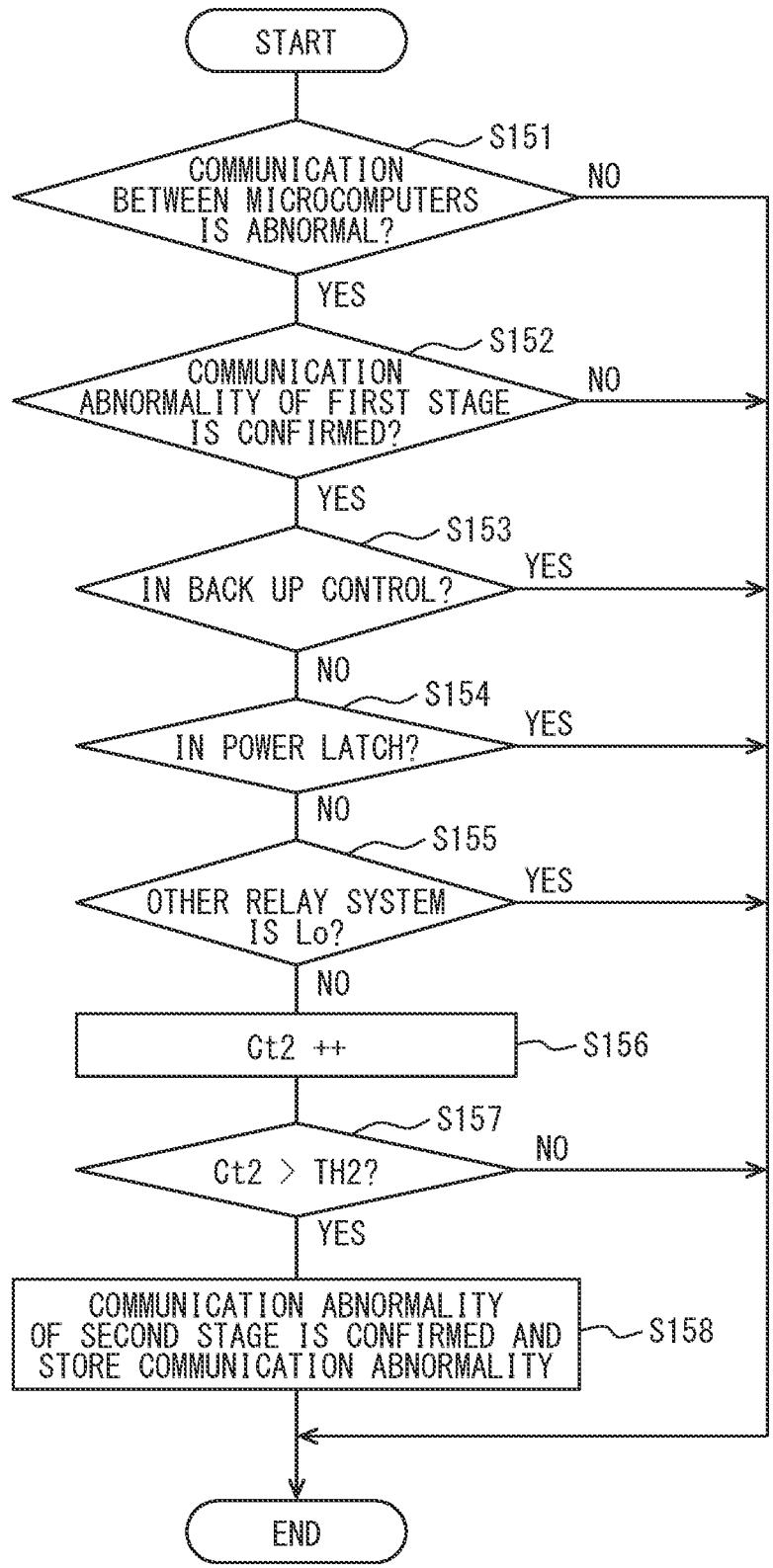
FIG. 9 is a flowchart showing a diagnostic storage process according to the first embodiment.

In FIGS. 9, S153 to S155 correspond to a diagnosis storage mask condition determination, and when the affirmative determination is made in S153, the other system stop has already been confirmed, so that it is determined that the diagnosis storage mask condition related to the communication abnormality between microcomputers is established. When an affirmative determination is made in S155, it is determined that the relay of the other system is Lo, communication is not possible due to the stop of the other system instead of the communication between the microcomputers, and the diagnostic storage mask condition related to the communication abnormality between the microcomputers is satisfied. Further, when the affirmative determination is made in S154, it is determined that the diagnostic storage mask condition related to the communication abnormality between the microcomputers is satisfied because the power latch is in progress and the IG is normally turned off. When a negative determination is made in S153 to S155, it is determined that the diagnostic storage mask condition is not satisfied. The order of S153 to S155 may be changed, or some processes may be omitted.

Figure 10:
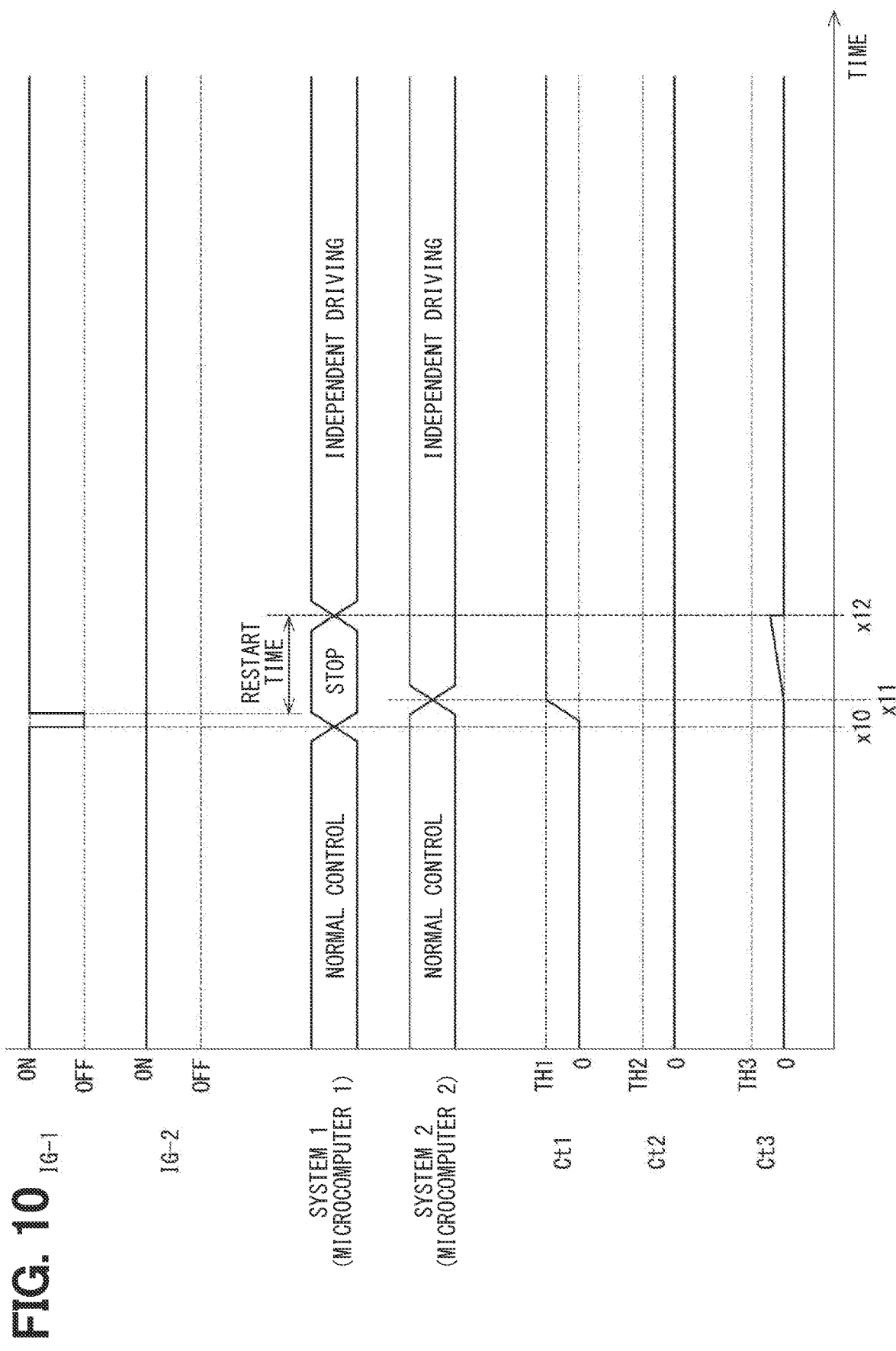
FIG. 10 is a time chart for explaining communication abnormality process according to the first embodiment.

The communication abnormality process will be described with reference to the time charts of FIGS. 10 to 13. In FIG. 10, from the upper chart, the power supply state to the first control unit 150 (described as "IG-1" in the figure), the power supply state to the second control unit 250 (described as "IG-2" in the figure), the drive mode of the first system L1, the drive mode of the second system L2, the first-stage communication abnormality counter Ct1, the second-stage communication abnormality counter Ct2, and the other system monitoring counter Ct3. Hereinafter, a case where an abnormality occurs in the first system L1 will be described as an example, and the counters Ct1, Ct2, and Ct3 will be the values in the second control unit 250. Further, the state in which power is supplied to the control units 150 and 250 is referred to as "power on", and the state in which power supply is interrupted is referred to as "power off". FIGS. 11 to 14 and 18 are substantially the same.

Figure 18:
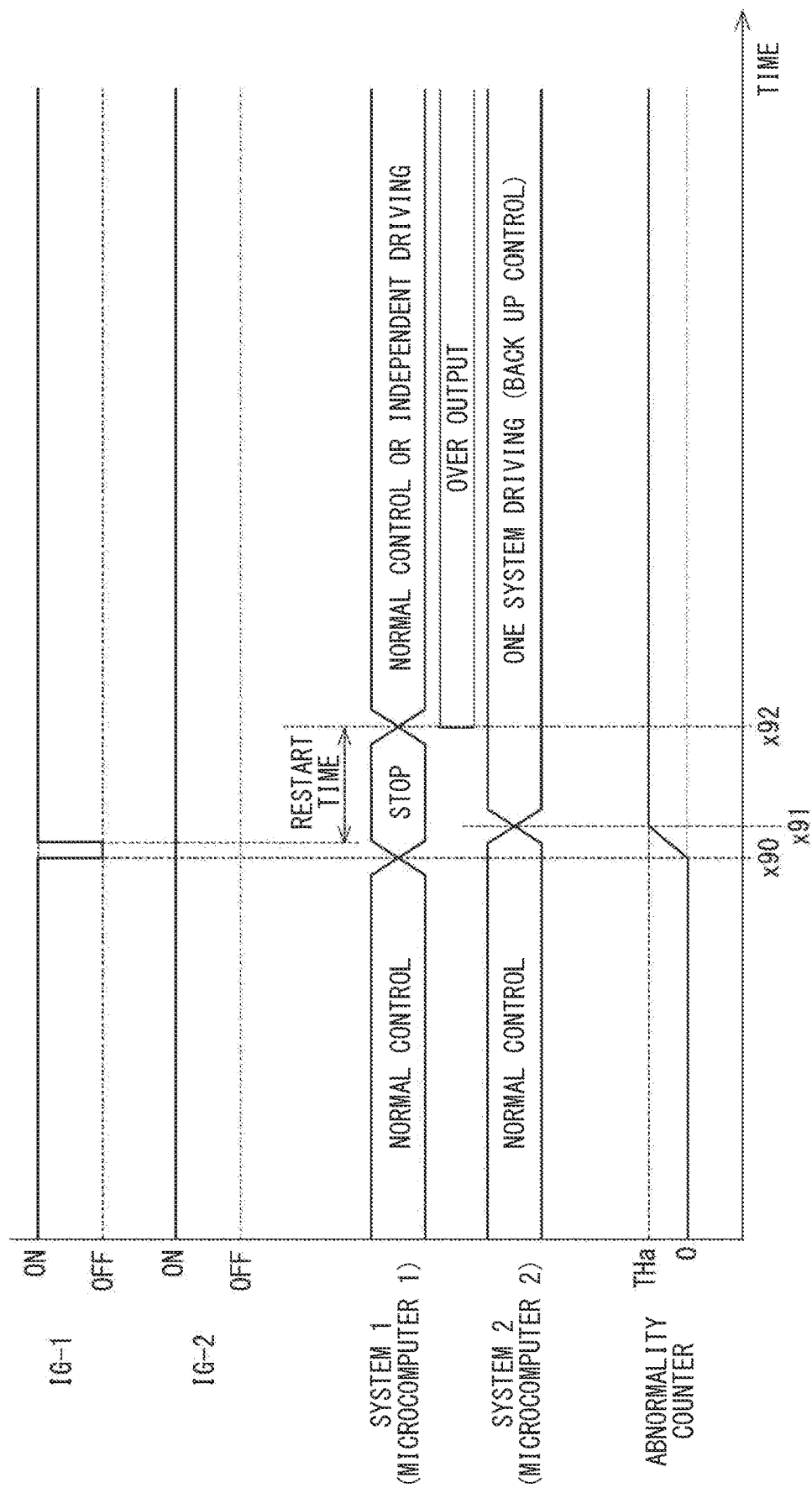
FIG. 18 is a time chart for explaining communication abnormality process according to the reference example.

Prior to the description of the present embodiment, a reference example will be described with reference to FIGS. 17 and 18. In the reference example, one counter is used to simultaneously perform abnormality treatment and diagnostic storage. As shown in FIG. 18, when an abnormality occurs in which the power supply is interrupted in the first system L1 at the time x90, the microcomputer of the first control unit 150 is stopped. At this time, the second control unit 250 detects an abnormality in communication between the microcomputers and starts counting the abnormality counter.

When the count value of the abnormality counter reaches a confirmation threshold value THa at the time x91, the second control unit 250 determines that the first system L1 which is the partner system has stopped, stores the abnormality information of the partner system stop as a diagnosis, and shifts from a normal control to a backup control.

Here, when the abnormality that occurred at the time x90 is a momentary power interruption, when the power supply to the first system L1 is restarted, the microcomputer of the first control unit 150 is restarted at the time x92. Here, at time x92, when the second system L2 has already shifted to the backup control and increased the output, the first control unit 150 after restarting drives the motor 80 in the cooperative drive mode or the independent drive mode. In this configuration, there is a possibility of excessive output. Further, even though the power supply is temporarily interrupted, the diagnosis of the other system stop is stored, so that there is a possibility that unnecessary measures such as repair or replacement of the first control unit 150 may be performed.

Therefore, in the present embodiment, the abnormality determination related to the change of the drive mode and the abnormality determination related to the diagnostic storage are separated, and a two-stage confirmation is performed in which different confirmation times are set. Further, the transition from the independent drive mode to the backup control is based on the information of monitoring of the other system, and the drive mode is switched and the diagnosis is stored by using the three counters.

As shown in FIG. 10, when the power supply of the first system L1 is momentarily interrupted at time x10, the microcomputer of the first control unit 150 is stopped. The second control unit 250 detects a communication abnormality between microcomputers and starts counting of the first stage communication abnormality counter Ct1. When the first-stage communication abnormality counter Ct1 exceeds the first-stage confirmation determination value TH1 at time x11, the second control unit 250 switches the drive mode to the independent drive mode. In the independent drive mode, the output characteristics are not changed, so that when the first system L1 is stopped, the output is halved from the normal state. Further, since the other system relay becomes Lo while the microcomputer of the first control unit 150 is restarting, the counting of the other system monitoring counter Ct3 is started. At this time, since the other system relay is Lo and the diagnostic storage mask condition is satisfied, the second-stage communication abnormality counter Ct2 is not counted.

When the restart of the microcomputer of the first control unit 150 is completed at the time x12, the relay of the other system becomes Hi, so that the monitoring counter Ct3 of the other system is reset. Further, when the first control unit 150 acquires the information that the second system L2 is in the independent drive mode by the communication between the microcomputers, the first control unit 150 performs the drive control of the motor 80 in the independent drive mode. As a result, the configuration can prevent the storage unit 256 of the second control unit 250 from storing, an abnormality of the first control unit 150, a false diagnosis that the temporary stop and restart of the first control unit 150 due to a momentary power interruption or the like. Further, after the first control unit 150 is restarted, the drive control of the motors 80 in the two systems is performed in the independent drive mode, so that it is possible to prevent the output decrease and the excessive output.

FIG. 11 shows an example in which the power of the first system L1 is turned off at time x20 and the off state is continued. The processing of the time x20 and the time x21 is the same as the processing of the time x10 and the time x11 in FIG. 10. When the power-off state of the first system L1 is continued, Lo of the other system relay is continued. When the other system monitoring counter Ct3 exceeds the other system abnormality confirmation determination value TH3 at the time x22, the second control unit 250 stores the other system stop as a diagnosis in the storage unit 256. In addition, the drive mode is switched from the independent drive mode to the single system drive mode, the control is shifted to the backup control, and the output characteristics are changed.

FIG. 12 is an example in which a communication error between microcomputers occurs at time x30. In this example, the power supplies of the systems L1 and L2 are on, and the counters Ct1, Ct2, and Ct3 have the same values in the control units 150 and 250. When a communication error between microcomputers occurs at time x30, counting of the first-stage communication error counter Ct1 is started. When the first-stage communication abnormality counter Ct1 exceeds the first-stage confirmation determination value TH1 at time x31, each of the systems L1 and L2 shifts to the independent drive mode.

In this example, since communication other than communication between microcomputers is normal, the other system monitoring counter Ct3 is not counted. Further, since the diagnostic storage mask condition is not satisfied, the counting of the second-stage communication abnormality counter Ct2 is started. When the second-stage communication abnormality counter Ct2 exceeds the second-stage confirmation determination value TH2 at time x32, the control units 150 and 250 store the communication abnormality between microcomputers as a diagnosis in their own storage units 156 and 256, respectively. For example, considering that the information stored in the storage units 156 and 256 is used for failure analysis and the like, there is no actual harm even if the diagnostic storage timing is delayed from the switching of the drive mode.

FIG. 13 is an example in which the power supply of the first system L1 is restored after the backup control shift. Here, the description of the time required for restarting the first control unit 150 is omitted. The same applies to FIG. 16 described later. The process of time x40 to time x42 is the same as the process of time x20 to time x22 in FIG. 11. At time x43, the power supply to the first system L1 is restored to normal, and the first control unit 150 is activated. At this time, when the first control unit 150 acquires the information that the second system L2 has been shifted to the backup control by the communication between the microcomputers. The first control unit 150 does not cause the first system L1 to perform the drive control of the motor 80 and to be in the assist stop state so as not to be an excessive assist. Since the microcomputer of the first control unit 150 is operating, a process other than the drive control of the motor 80, such as abnormality monitoring, may be performed. Further, in this case, the other system is stopped for a relatively long time, and the other system stop remains as a diagnosis.

As described above, the control units 150 and 250 of the ECU 10 of the present embodiment include drive control units 151 and 251, abnormality monitor units 155 and 255, and storage units 156 and 256. The drive control units 151 and 251 control the operation of the motor 80 to be controlled. The abnormality monitor unit 155 and 255 perform abnormality monitoring. The storage units 156 and 256 store abnormality information according to the abnormality monitoring result. In the present embodiment, when the abnormality of the monitor target is detected, an abnormality treatment confirmation determination related to a transition determination to an abnormality treatment due to an occurrence of the abnormality is different from an abnormality storage confirmation determination that causes the storage unit to store, as the abnormality information, the abnormality of the monitor target. As a result, the monitored abnormality can be appropriately stored.

Specifically, a timer related to an abnormal time treatment confirmation determination and a timer related to an abnormal memory confirmation determination are separately provided, and the timing of the abnormal time confirmation determination and the timing of the abnormal memory confirmation are different. The time from a time point at which the abnormality of the monitor target is detected to the time point of the abnormality storage confirmation determination is longer than the time from the time point at which the abnormality of the monitor target is detected to the time point of the abnormality treatment confirmation determination. This configuration makes it possible to reduce the probability that an erroneous abnormality history will be stored.

The ECU 10 is provided with a plurality of control units 150, 250 having drive control units 151, 251, abnormality monitor units 155, 255, and storage units 156, 256. The abnormality of the monitor target of the present embodiment is an incoordination abnormality that is a communication abnormality or a synchronization abnormality between the control units 150 and 250. Further, the time from the time point at which the abnormality of the monitor target is detected to the time point of the abnormality storage confirmation determination is set according to the time required for restarting the control units 150 and 250. As a result, since a temporary abnormality due to an external factor such as a momentary power interruption is not stored, the probability that an erroneous abnormality history is stored can be reduced.

The control units 150 and 250 mask the abnormal memory confirmation determination when the other control unit is stopped. Specifically, when the other control unit is stopped, the abnormality determination time in the second stage is not measured, and the abnormality information related to the incoordination abnormality is not stored. As a result, it is possible to avoid erroneously memorizing the state of being incoordinating due to the stoppage of the other system or normal IG off as an incoordination abnormality.

The control units 150 and 250 can monitor the control status of the motor 80 by another control unit based on the relay information of another system acquired separately from the communication between the control units 150 and 250 to be monitored. Further, when an incoordination abnormality has occurred and another system stop is confirmed based on the relay information of another system, the control units 150 and 250 causes their own storage units 156 and 256 to store the information related to another system stop as the abnormality information. As a result, information related to the stop of another systems can be appropriately stored.

The time from a time point at which the incoordination abnormality is detected to the time point of the another system stop confirmation determination is longer than the time from the time point at which the incoordination abnormality is detected to the time point of the abnormality treatment confirmation determination. This configuration makes it possible to reduce the probability that an erroneous abnormality history will be stored. Further, the time from the time point at which the incoordination abnormality is detected to the time point of the another system stop confirmation determination is set according to the time required for restarting of the control units 150 and 250. As a result, since a temporary abnormality due to an external factor such as a momentary power interruption is not stored, the probability that an erroneous abnormality history is stored can be reduced.

When it is determined that the other system is stopped, the control units 150 and 250 shift to the backup control different from the abnormality treatment. The abnormality treatment of the present embodiment is transition to the independent drive mode, and does not shift to the backup control until it is determined that the other system is stopped. The control units 150 and 250 maintain the stopped state of the own system when the other system shifts to the backup control at the time of its own startup. As a result, it is possible to avoid inconsistency in control when returning from the temporary stop state.

Specifically, in the backup control of the present embodiment, the output characteristic is changed so as to supplement the output of another system. By setting the independent drive mode in which the output characteristic is not changed without shifting to the backup control until the other system stop confirmation determination is made, it is possible to prevent the excessive output when the other system recovers from the temporary stop. In addition, when the other system has already shifted to the backup control, the excessive output can be prevented by maintaining the stopped state of the own system.

Second Embodiment

Figure 14:
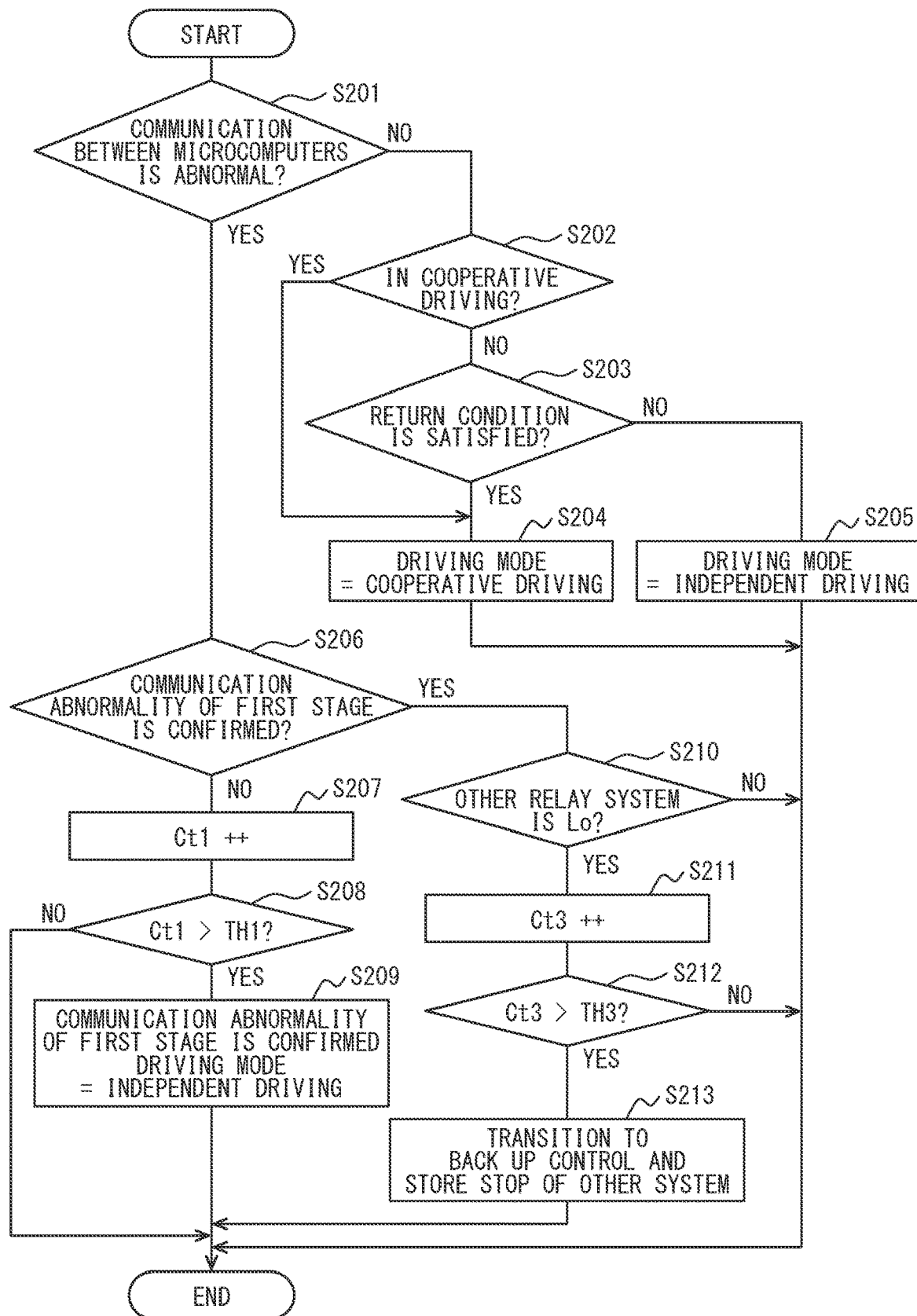
FIG. 14 is a flowchart showing a drive mode selection process according to a second embodiment.
Figure 15:
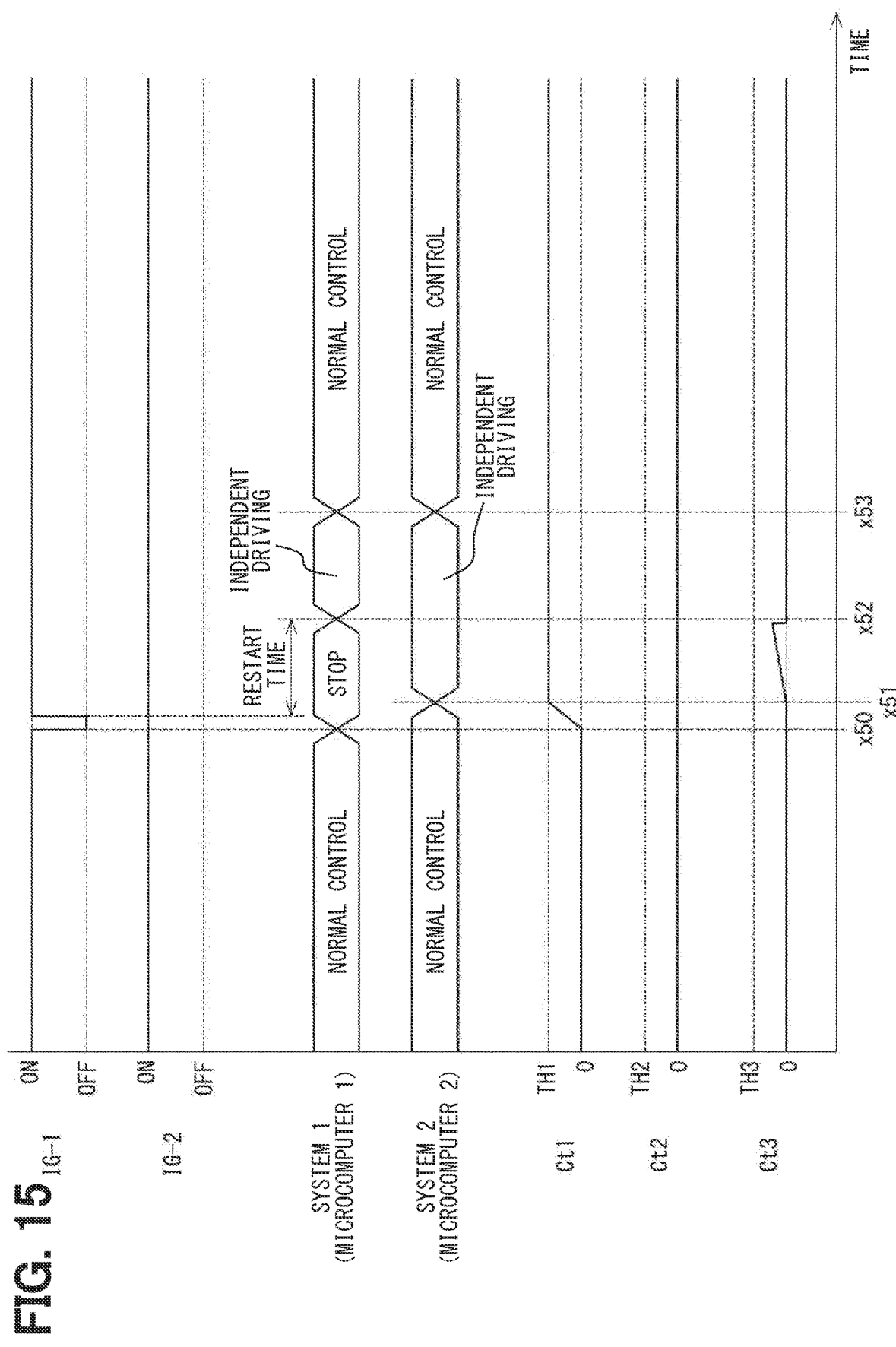
FIG. 15 is a time chart for explaining communication abnormality process according to the second embodiment.
Figure 16:
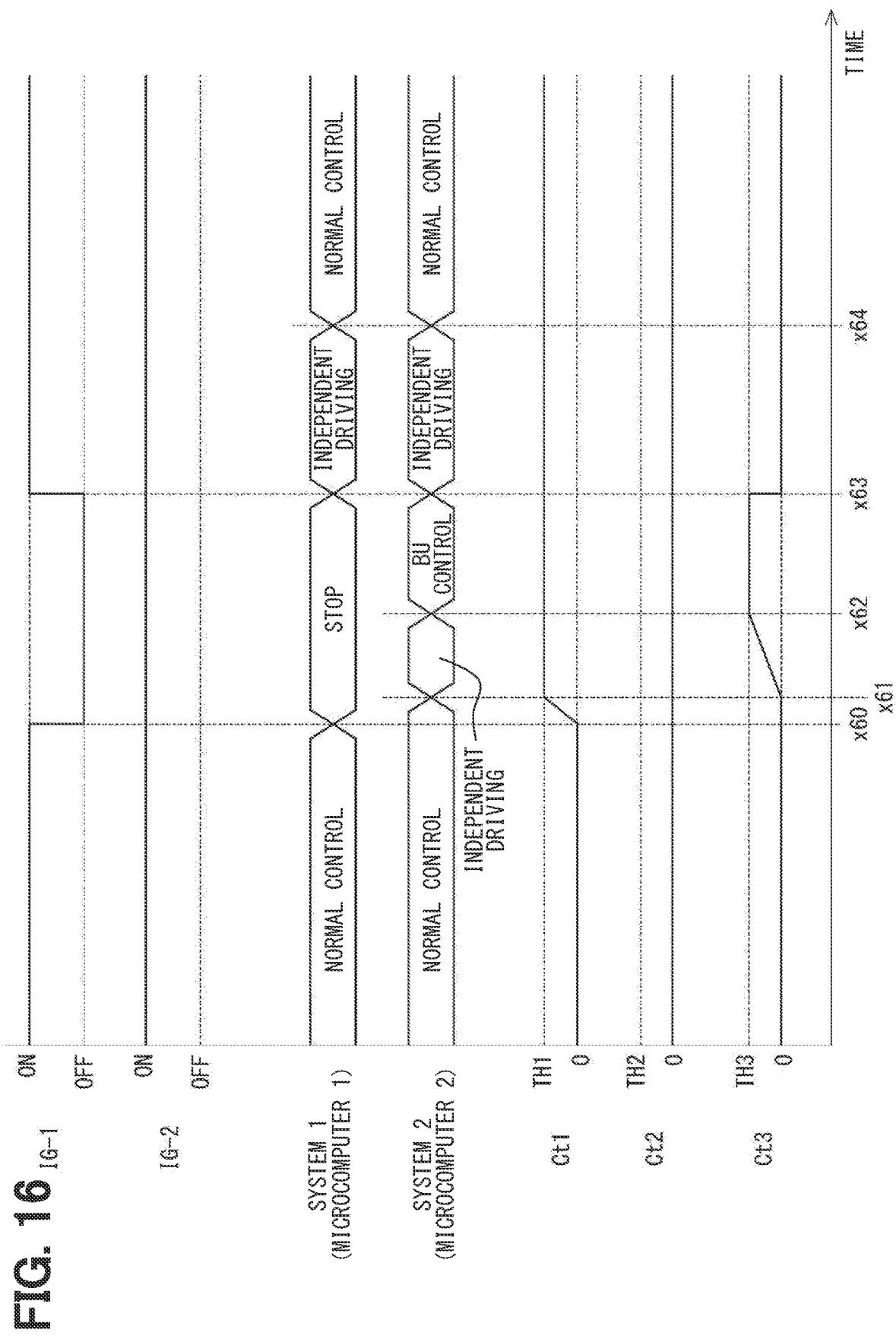
FIG. 16 is a time chart for explaining communication abnormality process according to the second embodiment.

A second embodiment is shown in FIG. 14 to FIG. 16. The present embodiment is different from the embodiments described above in the drive mode selection process, and therefore, explanation will be made mainly on this issue. In the present embodiment, even when the mode shifts to the independent drive mode or the one-system mode, if the cooperative drive mode can be restored, the cooperative drive mode is restored.

This drive mode selection process in the present embodiment will be described with reference to a flowchart of FIG. 14. The processing of S201 and S202 is the same as the processing of S101 and S102 in FIG. 8. When the communication between the microcomputers is abnormal, the process proceeds to S206. Further, when the communication between the microcomputers is normal and the cooperative drive is in progress, the process proceeds to S204 and the cooperative drive is continued, and when the cooperative drive is not in progress, the process proceeds to S203.

In S203, the control units 150 and 250 determine whether or not the cooperative return condition is satisfied. When it is determined that the cooperative return condition is satisfied (S203: YES), the process proceeds to S204 and the drive mode is switched to the cooperative drive mode. When it is determined that the cooperative return condition is not satisfied (S203: NO), the process proceeds to S205 and the drive mode is set to the independent drive mode. The processing of S206 to S213 is the same as the processing of S107 to S114 in FIG. 8.

The cooperative return condition will be described. In the present embodiment, when a command deviation ΔI *, which is the absolute value of the difference between the first current command value calculated by the first control unit 150 and the second current command value calculated by the second control unit 250, is smaller than a deviation determination value ΔI_th, it is considered that there is no command deviation between the systems and it is determined that the cooperative return is possible. Further, when the first current limit value Ilim1 calculated by the first control unit 150 and the second current limit value Ilim2 calculated by the second control unit 250 are both greater than the return determination value, it is determined that cooperative return is possible. Further, when the steering torque Ts is smaller than the non-steering determination value Ts_th, it is determined that the cooperative return is possible. Furthermore, when the vehicle speed V is smaller than the vehicle speed determination value V_th, it is determined that the cooperative return is possible.

That is, in the present embodiment, when the command deviation ΔI * is smaller than the deviation determination value ΔI_th, the current limit values Illim1 and Ilim2 are greater than the return determination value, the steering torque Ts is smaller than the non-steering determination value Ts_th, and the vehicle speed V is the vehicle speed determination, it is determined that the cooperative return condition is satisfied. As a supplement, when the communication error between microcomputers returns to normal after the communication abnormality between microcomputers, it is considered that the incoordination abnormality has been resolved.

The communication abnormality process will be described with reference to the time charts of FIGS. 15 to 16. FIG. 15 is an example in the case where a momentary power interruption occurs as in FIG. 10, and the processing of the time x50 to the time x52 is the same as the processing of the time x10 to the time x12 in FIG. 10. When the cooperative return condition is satisfied at time x53, both the systems L1 and L2 switch the drive mode from the independent drive mode to the cooperative drive mode and return to the normal control.

FIG. 16 is an example in which the power supply of the first system L1 is restored after the backup control shift as in FIG. 13. The process of time x60 to time x62 is the same as the process of time x40 to time x42 in FIG. 13. When the power supply to the first system L1 is restored to normal at time x63 and the first control unit 150 is activated, the communication between the microcomputers becomes normal. Therefore, the drive mode is set to the independent drive mode for both the systems L1 and L2. When the cooperative return condition is satisfied at time x64, both the systems L1 and L2 switch the drive mode from the independent drive mode to the cooperative drive mode and return to the normal control. At this time, since the period during which the power supply is stopped is longer than the other system abnormality confirmation time corresponding to the other system abnormality confirmation determination value TH3, the diagnosis of the other system stop remains.

In the present embodiment, the control units 150 and 250 return to the normal control when the incoordination abnormality is resolved and the cooperative return condition is satisfied. As a result, when a part of the system returns to normal after the abnormality is confirmed, it is possible to appropriately return to the normal control. In addition, the same effects as those of the embodiments described above can be obtained.

In the above embodiment, the ECU 10 corresponds to a "control device", the motor 80 corresponds to a "control target", the drive control units 151, 251 correspond to "operation control unit", the communication abnormality between microcomputers corresponds to "communication abnormality between control units", the relay information of other systems corresponds to "monitor information of other systems", and the restart by the microcomputer corresponds to "restart of the control unit".

Other Embodiments

In the above embodiments, the abnormality to be monitored is an incoordination abnormality, and the incoordination abnormality includes a communication abnormality between the microcomputers and a synchronization abnormality. In another embodiment, either the communication abnormality between the microcomputers or the synchronization abnormality may be regarded as an incoordination abnormality. Further, the monitored abnormality may be an abnormality other than the incoordination abnormality. In the above embodiments, the other system monitor information is the other system relay information. In another embodiment, the other system monitor information may use information other than the other system relay information capable of monitoring the state of the other system. In the above embodiments, the relay information of the other system is directly acquired by using the monitoring circuit of the other system. In another embodiment, the other system monitor information may be acquired by communication separate from the communication for the shared control information.

In the above embodiments, the determination timing is different, so that the determination of the treatment at the time of abnormality and the determination of the confirmation of the abnormal memory are different. In another embodiment, the determination condition other than the determination timing may be different, so that the determination of the treatment at the time of abnormality and the determination of the confirmation of the abnormal memory may be different. Further, in the above embodiments, the abnormality treatment is a transition to the independent drive mode. In another embodiment, the abnormality treatment may be a treatment other than the transition to the independent drive mode. In the above embodiments, the abnormality confirmation time in the second stage and the other system stop confirmation determination time are equal. In another embodiment, the abnormality confirmation time in the second stage and the other system stop confirmation determination time may be different.

In the second embodiment, the steering state is determined based on the steering torque. In another embodiment, the steering state may be determined based on the steering wheel speed, the motor speed, or the rack speed, not limited to the steering torque. Further, in another embodiment, the steering state may be determined based on the current command value and the current detection value. When the value of the current command value is large, it is highly probable that the vehicle is being steered. Therefore, when the current command value is larger than the determination threshold value, it is determined that the vehicle is being steered, and when the current command value is smaller than the determination threshold value, it is determined that the vehicle is not being steered. The same applies to the current detection value. Further, the steering state may be determined using two or more of the steering torque, the steering speed, the motor speed, the rack speed, the current command value, and the current detection value.

In the second embodiment, the command deviation, the current limit value, the steering torque, and the vehicle speed are used as the cooperative return determination condition. In another embodiment, as the cooperative return determination condition, a part of the above four determination conditions exemplified may be omitted, or another determination condition may be added, for example, an item related to the behavior of the vehicle such as the lateral G of the vehicle and the yaw rate.

In the above embodiments, the current instruction value, the current detection value and the current limit value are shared between the systems in the cooperative drive mode. As the other embodiment, the current limit values may not be shared in the cooperative drive mode. In the above embodiments, assuming that the first control unit 150 is the master control unit and the second control unit 250 is the slave control unit, the current command value calculated by the first control unit 150 is used commonly in the control units 150 and 250 in the cooperative drive mode. However, the current command value may not be shared, and the current command value of the own system may be used even in the cooperative drive mode. Further, values other than the current command value, the current detection value and the current limit value may be shared.

In the above embodiments, two motor windings, two inverter units and two control units are provided. However, the number of motor windings may be one or more than three. Further, the number of inverter units and the number of control units may be one or three or more. Further, for example, one control unit may be provided for a plurality of motor windings and a plurality of inverter units. A plurality of inverter units and a plurality of motor windings may be provided for one control unit. That is, the numbers of the motor windings, inverter units and control units may be different. In the above embodiment, the power supply is provided for each system, and the ground of each system is separated. In the other embodiment, one power supply may be shared by a plurality of systems. Further, a plurality of systems may be connected to the common ground.

In the embodiment described above, the rotary electric machine is a three-phase brushless motor. In the other embodiment, the rotary electric machine is not limited to the brushless motor. Further, the rotary electric machine may be a motor-generator that also has a function of a generator. In the above embodiment, the control unit is applied to the electric power steering device. In the other embodiment, the rotary electric machine control device may be applied to an apparatus such as a steer-by-wire apparatus, which is other than the electric power steering device for steering control. Further, it may be applied to an in-vehicle apparatus other than the steering apparatus or an apparatus other than the in-vehicle apparatus.

The control unit and the technique according to the present disclosure may be achieved by a dedicated computer provided by constituting a processor and a memory programmed to execute one or more functions embodied by a computer program. Alternatively, the control unit and the method described in the present disclosure may be realized by a dedicated computer configured as a processor with one or more dedicated hardware logic circuits. Alternatively, the control unit and method described in the present disclosure may be realized by one or more dedicated computer, which is configured as a combination of a processor and a memory, which are programmed to perform one or more functions, and a processor which is configured with one or more hardware logic circuits. The computer program may be stored, as instructions to be executed by a computer, in a tangible non-transitory computer-readable medium. As described above, the present disclosure is not limited to the embodiments described above, and can be implemented in various forms without departing from the spirit of the present disclosure.

The present disclosure has been described in accordance with the embodiments. However, the present disclosure is not limited to such embodiments and structures. The present disclosure also encompasses various modifications and variations within the scope of equivalents. Furthermore, various combination and formation, and other combination and formation including one, more than one or less than one element may be made in the present disclosure.

What is claimed is:

1. A control device comprising:
an operation control unit configured to control an operation of a control target;
an abnormality monitor unit configured to monitor an abnormality; and
a storage unit configured to store abnormality information according to an abnormality monitor result, wherein
when the abnormality of a monitor target is detected, an abnormality treatment confirmation determination related to a transition determination to an abnormality treatment due to an occurrence of the abnormality is different from an abnormality storage confirmation determination that causes the storage unit to store, as the abnormality information, the abnormality of the monitor target,
the control device is provided by a plurality of control units each including the operation control unit, the abnormality monitor unit, and the storage unit, and the abnormality of the monitor target is an incoordination abnormality that is a communication abnormality or a synchronization abnormality between the plurality of control units.

2. The control device according to claim 1, wherein
a time point of the abnormality treatment confirmation determination and a time point of the abnormality storage confirmation determination are different from each other, and
time from a time point at which the abnormality of the monitor target is detected to the time point of the abnormality storage confirmation determination is longer than time from the time point at which the abnormality of the monitor target is detected to the time point of the abnormality treatment confirmation determination.

3. The control device according to claim 1, wherein
a control unit of the plurality of control units masks the abnormality storage confirmation determination when another control unit of the plurality of control units is stopped.

4. The control device according to claim 1, wherein
time from a time point at which the incoordination abnormality is detected to a time point of the abnormality storage confirmation determination is set according to time required for restarting of a control unit.

5. The control device according to claim 1, wherein
a control unit of the plurality of control units is configured to monitor a control status of the control target by another control unit based on another system monitor information acquired separately from, as the monitor target, communication between the plurality of control units, and
the control unit causes the storage unit to store, as the abnormality information, information related to a stop of another system when the incoordination abnormality occurs and another system stop confirmation determination based on another system monitor information is made.

6. The control device according to claim 5, wherein
time from a time point at which the incoordination abnormality is detected to a time point of the another system stop confirmation determination is longer than time from the time point at which the incoordination abnormality is detected to a time point of the abnormality treatment confirmation determination.

7. The control device according to claim 6, wherein
the time from the time point at which the incoordination abnormality is detected to the time point of the another system stop confirmation determination is set according to time required for restarting of the control unit.

8. The control device according to claim 5, wherein
when the another system stop confirmation determination is made, the control unit transitions to a backup control different from the abnormality treatment.

9. The control device according to claim 8, wherein
when the control unit is restarted and another system has transitioned to the backup control, the control unit maintains a stopped state of a system of the control unit.

10. The control device according to claim 3, wherein
the control unit returns to a normal control when the incoordination abnormality is resolved and a cooperative return condition is satisfied.

11. A control device comprising:
a processor configured to (i) control an operation of a control target, (ii) monitor an abnormality, and (iii) store abnormality information according to an abnormality monitor result, wherein
when the processor detects the abnormality of a monitor target, an abnormality treatment confirmation determination related to a transition determination to an abnormality treatment due to an occurrence of the abnormality is different from an abnormality storage confirmation determination that causes the processor to store, as the abnormality information, the abnormality of the monitor target,
the control device is provided by a plurality of control units each including an operation control unit, an abnormality monitor unit, and a storage unit, and
the abnormality of the monitor target is an incoordination abnormality that is a communication abnormality or a synchronization abnormality between the plurality of control units.

* * * * *